(12) United States Patent
Cummings

(10) Patent No.: US 7,299,681 B2
(45) Date of Patent: Nov. 27, 2007

(54) METHOD AND SYSTEM FOR DETECTING LEAK IN ELECTRONIC DEVICES

(75) Inventor: William Cummings, San Francisco, CA (US)

(73) Assignee: IDC, LLC, San Francisco, CA (US)

( * ) Notice: Subject to any disclaimer, the term of this patent is extended or adjusted under 35 U.S.C. 154(b) by 0 days.

(21) Appl. No.: 11/090,775

(22) Filed: Mar. 25, 2005

(65) Prior Publication Data

US 2006/0065043 A1    Mar. 30, 2006

Related U.S. Application Data

(60) Provisional application No. 60/613,385, filed on Sep. 27, 2004.

(51) Int. Cl.
*G01M 3/16* (2006.01)
*G01M 3/20* (2006.01)

(52) U.S. Cl. .................. 73/40; 73/40.5 R; 73/40.7; 73/49.2

(58) Field of Classification Search .......... 73/40–49.8
See application file for complete search history.

(56) References Cited

U.S. PATENT DOCUMENTS

| | | |
|---|---|---|
| 2,534,846 A | 12/1950 | Ambrose et al. |
| 3,416,359 A | 12/1968 | Durbln et al. |
| 3,439,973 A | 4/1969 | Paul et al. |
| 3,443,854 A | 5/1969 | Weiss |
| 3,578,758 A * | 5/1971 | Altshuler .................... 73/40.7 |
| 3,653,741 A | 4/1972 | Marks |
| 3,656,836 A | 4/1972 | de Cremoux et al. |
| 3,672,207 A * | 6/1972 | Cramp et al. ................ 73/40.7 |
| 3,813,265 A | 5/1974 | Marks |
| 3,899,295 A | 8/1975 | Halpern et al. |

(Continued)

FOREIGN PATENT DOCUMENTS

CH    685887 A5    10/1995

(Continued)

OTHER PUBLICATIONS

"Introduction to Helium Mass Spectrometer Detection", Varian Associates, Inc., 1980, pp. 66.*

(Continued)

*Primary Examiner*—Hezron Williams
*Assistant Examiner*—David A. Rogers
(74) *Attorney, Agent, or Firm*—Knobbe Martens Olson & Bear LLP

(57) ABSTRACT

The methods and systems for testing electronic devices for leak detection are provided. In one method of detecting a leak in a sealed package, a sealed package is placed in a test gas environment, allowing the test gas to diffuse into an internal space of the sealed package through a leak formed in the sealed package. Thereafter, the sealed package is placed in an environment substantially free of the test gas and allowing the test gas to diffuse out of the internal space. The amount of the test gas in the test gas-free environment is detected. Based on the information obtained from the detection, it is determined whether the sealed package has one or more unintended leaks based on information obtained from the detecting.

27 Claims, 15 Drawing Sheets

U.S. PATENT DOCUMENTS

| | | |
|---|---|---|
| 3,955,880 A | 5/1976 | Lierke |
| 3,956,923 A | 5/1976 | Young et al. |
| 4,001,808 A | 1/1977 | Ebihara et al. |
| 4,028,928 A * | 6/1977 | van Dalen et al. ............ 73/40.7 |
| 4,099,854 A | 7/1978 | Decker et al. |
| 4,158,960 A | 6/1979 | White et al. |
| 4,224,565 A | 9/1980 | Sosniak et al. |
| 4,228,437 A | 10/1980 | Shelton |
| 4,282,744 A * | 8/1981 | Dick .......................... 73/49.3 |
| 4,377,324 A | 3/1983 | Durand et al. |
| 4,389,096 A | 6/1983 | Hori et al. |
| 4,403,248 A | 9/1983 | Te Velde |
| 4,441,791 A | 4/1984 | Hornbeck |
| 4,445,050 A | 4/1984 | Marks |
| 4,482,213 A | 11/1984 | Piliavin et al. |
| 4,500,171 A | 2/1985 | Penz et al. |
| 4,519,676 A | 5/1985 | te Velde |
| 4,531,126 A | 7/1985 | Sadones |
| 4,553,435 A * | 11/1985 | Goldfarb et al. .............. 73/40.7 |
| 4,565,093 A * | 1/1986 | Jurva et al. ................... 73/40.7 |
| 4,566,935 A | 1/1986 | Hornbeck |
| 4,571,603 A | 2/1986 | Hornbeck et al. |
| 4,596,992 A | 6/1986 | Hornbeck |
| 4,608,866 A * | 9/1986 | Bergquist .................... 73/40.7 |
| 4,615,595 A | 10/1986 | Hornbeck |
| 4,662,746 A | 5/1987 | Hornbeck |
| 4,663,083 A | 5/1987 | Marks |
| 4,681,403 A | 7/1987 | te Velde et al. |
| 4,710,732 A | 12/1987 | Hornbeck |
| 4,748,366 A | 5/1988 | Taylor |
| 4,785,666 A * | 11/1988 | Bergquist .................... 73/40.7 |
| 4,786,128 A | 11/1988 | Birnbach |
| 4,790,635 A | 12/1988 | Apsley |
| 4,856,863 A | 8/1989 | Sampsell et al. |
| 4,897,360 A | 1/1990 | Guckel et al. |
| 4,920,785 A * | 5/1990 | Etess .......................... 73/40.7 |
| 4,954,789 A | 9/1990 | Sampsell |
| 4,956,619 A | 9/1990 | Hornbeck |
| 5,018,256 A | 5/1991 | Hornbeck |
| 4,982,184 A | 6/1991 | Kirkwood |
| 5,022,745 A | 6/1991 | Zayhowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,096,279 A | 3/1992 | Hornbeck et al. |
| 5,099,353 A | 3/1992 | Hornbeck |
| 5,124,834 A | 6/1992 | Cusano et al. |
| 5,142,405 A | 8/1992 | Hornbeck |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,172,262 A | 12/1992 | Hornbeck |
| 5,175,772 A | 12/1992 | Kahn et al. |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,214,419 A | 5/1993 | DeMond et al. |
| 5,214,420 A | 5/1993 | Thompson et al. |
| 5,216,537 A | 6/1993 | Hornbeck |
| 5,226,099 A | 7/1993 | Mignardi et al. |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,254,980 A | 10/1993 | Hendrix et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,296,950 A | 3/1994 | Lin et al. |
| 5,305,640 A | 4/1994 | Boysel et al. |
| 5,307,139 A | 4/1994 | Tyson, II et al. |
| 5,311,360 A | 5/1994 | Bloom et al. |
| 5,312,513 A | 5/1994 | Florence et al. |
| 5,323,002 A | 6/1994 | Sampsell et al. |
| 5,325,116 A | 6/1994 | Sampsell |
| 5,327,286 A | 7/1994 | Sampsell et al. |
| 5,331,454 A | 7/1994 | Hornbeck |
| 5,339,116 A | 8/1994 | Urbanus et al. |
| 5,365,283 A | 11/1994 | Doherty et al. |
| 5,381,253 A | 1/1995 | Sharp et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,454,906 A | 10/1995 | Baker et al. |
| 5,457,493 A | 10/1995 | Leddy et al. |
| 5,457,566 A | 10/1995 | Sampsell et al. |
| 5,459,409 A | 10/1995 | Henley et al. |
| 5,459,602 A | 10/1995 | Sampsell |
| 5,459,610 A | 10/1995 | Bloom et al. |
| 5,461,411 A | 10/1995 | Florence et al. |
| 5,489,952 A | 2/1996 | Gove et al. |
| 5,497,172 A | 3/1996 | Doherty et al. |
| 5,497,197 A | 3/1996 | Gove et al. |
| 5,499,062 A | 3/1996 | Urbanus |
| 5,500,635 A | 3/1996 | Mott |
| 5,500,761 A | 3/1996 | Goossen et al. |
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,688 A | 6/1996 | Boysel et al. |
| 5,535,047 A | 7/1996 | Hornbeck |
| 5,548,301 A | 8/1996 | Kornher et al. |
| 5,551,293 A | 9/1996 | Boysel et al. |
| 5,552,924 A | 9/1996 | Tregilgas |
| 5,563,398 A | 10/1996 | Sampsell |
| 5,567,334 A | 10/1996 | Baker et al. |
| 5,570,135 A | 10/1996 | Gove et al. |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,597,736 A | 1/1997 | Sampsell |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |
| 5,610,438 A | 3/1997 | Wallace et al. |
| 5,610,624 A | 3/1997 | Bhuva |
| 5,610,625 A | 3/1997 | Sampsell |
| 5,619,059 A | 4/1997 | Li et al. |
| 5,619,365 A | 4/1997 | Rhoades et al. |
| 5,619,366 A | 4/1997 | Rhoads et al. |
| 5,636,052 A | 6/1997 | Arney et al. |
| 5,646,768 A | 7/1997 | Kaeiyama |
| 5,650,881 A | 7/1997 | Hornbeck |
| 5,654,741 A | 8/1997 | Sampsell et al. |
| 5,657,099 A | 8/1997 | Doherty et al. |
| 5,659,374 A | 8/1997 | Gale, Jr. et al. |
| 5,665,997 A | 9/1997 | Weaver et al. |
| 5,703,710 A | 12/1997 | Brinkman et al. |

| | | | | | | |
|---|---|---|---|---|---|---|
| 5,710,656 | A | 1/1998 | Goosen | 6,811,267 B1 | 11/2004 | Allen et al. |
| 5,729,245 | A | 3/1998 | Gove et al. | 6,819,469 B1 | 11/2004 | Koba |
| 5,739,945 | A | 4/1998 | Tayebati | 6,822,628 B2 | 11/2004 | Dunphy et al. |
| 5,745,193 | A | 4/1998 | Urbanus et al. | 6,822,742 B1 * | 11/2004 | Kalayeh et al. ............. 356/437 |
| 5,745,281 | A | 4/1998 | Yi et al. | 6,824,739 B1 | 11/2004 | Arney et al. |
| 5,771,116 | A | 6/1998 | Miller et al. | 6,829,132 B2 | 12/2004 | Martin et al. |
| 5,784,190 | A | 7/1998 | Worley | 6,843,107 B2 * | 1/2005 | Newman et al. ............. 73/49.3 |
| 5,784,212 | A | 7/1998 | Hornbeck | 6,853,129 B1 | 2/2005 | Cummings et al. |
| 5,818,095 | A | 10/1998 | Sampsell | 6,855,610 B2 | 2/2005 | Tung et al. |
| 5,825,528 | A | 10/1998 | Goosen | 6,859,218 B1 | 2/2005 | Luman et al. |
| 5,835,255 | A | 11/1998 | Miles | 6,861,277 B1 | 3/2005 | Monroe et al. |
| 5,842,088 | A | 11/1998 | Thompson | 6,862,022 B2 | 3/2005 | Slupe |
| 5,912,758 | A | 6/1999 | Knipe et al. | 6,862,029 B1 | 3/2005 | D'Souza et al. |
| 5,986,796 | A | 11/1999 | Miles | 6,867,896 B2 | 3/2005 | Miles |
| 6,028,690 | A | 2/2000 | Carter et al. | 6,870,581 B2 | 3/2005 | Li et al. |
| 6,038,056 | A | 3/2000 | Florence et al. | 6,870,654 B2 | 3/2005 | Lin et al. |
| 6,040,937 | A | 3/2000 | Miles | 6,882,458 B2 | 4/2005 | Lin et al. |
| 6,049,317 | A | 4/2000 | Thompson et al. | 6,882,461 B1 | 4/2005 | Tsai et al. |
| 6,055,090 | A | 4/2000 | Miles | 6,912,022 B2 | 6/2005 | Lin et al. |
| 6,061,075 | A | 5/2000 | Nelson et al. | 6,952,303 B2 | 10/2005 | Lin et al. |
| 6,088,474 | A | 7/2000 | Dudasko et al. | 6,958,847 B2 | 10/2005 | Lin |
| 6,099,132 | A | 8/2000 | Kaeriyama | 7,012,678 B2 * | 3/2006 | Enomoto et al. ........ 356/237.1 |
| 6,113,239 | A | 9/2000 | Sampsell et al. | 7,051,577 B2 * | 5/2006 | Komninos ............... 73/40.5 A |
| 6,147,790 | A | 11/2000 | Meier et al. | 7,123,216 B1 | 10/2006 | Miles |
| 6,160,833 | A | 12/2000 | Floyd et al. | 2001/0003487 A1 | 6/2001 | Miles |
| 6,180,428 | B1 | 1/2001 | Peeters et al. | 2002/0015215 A1 | 2/2002 | Miles |
| 6,201,633 | B1 | 3/2001 | Peeters et al. | 2002/0054424 A1 | 5/2002 | Miles |
| 6,223,586 | B1 * | 5/2001 | Dierenbach et al. ......... 73/45.5 | 2002/0075555 A1 | 6/2002 | Miles |
| 6,232,936 | B1 | 5/2001 | Gove et al. | 2002/0126364 A1 | 9/2002 | Miles |
| 6,282,010 | B1 | 8/2001 | Sulzbach et al. | 2002/0157033 A1 | 10/2002 | Cox |
| 6,285,207 | B1 | 9/2001 | Listwan | 2003/0016361 A1 | 1/2003 | Geradus et al. |
| 6,295,154 | B1 | 9/2001 | Laor et al. | 2003/0043157 A1 | 3/2003 | Miles |
| 6,323,982 | B1 | 11/2001 | Hornbeck | 2003/0063081 A1 | 4/2003 | Mutsumi et al. |
| 6,347,009 | B1 | 2/2002 | Takeuchi | 2003/0072070 A1 | 4/2003 | Miles |
| 6,407,560 | B1 | 6/2002 | Walraven et al. | 2003/0077881 A1 | 4/2003 | Ilaria et al. |
| RE37,847 | E | 9/2002 | Henley et al. | 2003/0112231 A1 | 6/2003 | Takashi |
| 6,447,126 | B1 | 9/2002 | Hornbeck | 2003/0154768 A1 * | 8/2003 | Shioya et al. ................ 73/40.7 |
| 6,465,355 | B1 | 10/2002 | Horsley | 2003/0202264 A1 | 10/2003 | Weber et al. |
| 6,466,358 | B2 | 10/2002 | Tew | 2003/0202265 A1 | 10/2003 | Reboa et al. |
| 6,473,274 | B1 | 10/2002 | Maimone et al. | 2003/0202266 A1 | 10/2003 | Ring et al. |
| 6,480,177 | B2 | 11/2002 | Doherty et al. | 2004/0004610 A1 | 1/2004 | Takashi et al. |
| 6,496,122 | B2 | 12/2002 | Sampsell | 2004/0027636 A1 | 2/2004 | Miles |
| 6,545,335 | B1 | 4/2003 | Chua et al. | 2004/0051929 A1 | 3/2004 | Sampsell et al. |
| 6,548,908 | B2 | 4/2003 | Chua et al. | 2004/0057043 A1 | 3/2004 | Newman et al. |
| 6,549,338 | B1 | 4/2003 | Wolverton et al. | 2004/0058532 A1 | 3/2004 | Miles et al. |
| 6,552,840 | B2 | 4/2003 | Knipe | 2004/0070400 A1 | 4/2004 | van Spengen |
| 6,567,715 | B1 | 5/2003 | Sinclair et al. | 2004/0080807 A1 | 4/2004 | Chen et al. |
| 6,574,033 | B1 | 6/2003 | Chui et al. | 2004/0125281 A1 | 7/2004 | Lin et al. |
| 6,589,625 | B1 | 7/2003 | Kothari et al. | 2004/0145049 A1 | 7/2004 | McKinnell et al. |
| 6,600,201 | B2 | 7/2003 | Hartwell et al. | 2004/0145811 A1 | 7/2004 | Lin et al. |
| 6,606,175 | B1 | 8/2003 | Sampsell et al. | 2004/0147056 A1 | 7/2004 | McKinnell et al. |
| 6,625,047 | B2 | 9/2003 | Coleman, Jr. | 2004/0147198 A1 | 7/2004 | Lin et al. |
| 6,626,027 | B1 * | 9/2003 | Davey ........................ 73/40.7 | 2004/0160143 A1 | 8/2004 | Shreeve et al. |
| 6,630,786 | B2 | 10/2003 | Cummings et al. | 2004/0174583 A1 | 9/2004 | Chen et al. |
| 6,632,698 | B2 | 10/2003 | Ives | 2004/0175577 A1 | 9/2004 | Lin et al. |
| 6,643,069 | B2 | 11/2003 | Dewald | 2004/0179281 A1 | 9/2004 | Reboa |
| 6,650,455 | B2 | 11/2003 | Miles | 2004/0206953 A1 | 10/2004 | Morena et al. |
| 6,666,561 | B1 | 12/2003 | Blakley | 2004/0207897 A1 | 10/2004 | Lin |
| 6,674,090 | B1 | 1/2004 | Chua et al. | 2004/0209192 A1 | 10/2004 | Lin et al. |
| 6,674,562 | B1 | 1/2004 | Miles | 2004/0209195 A1 | 10/2004 | Lin |
| 6,680,792 | B2 | 1/2004 | Miles | 2004/0212026 A1 | 10/2004 | Van Brocklin et al. |
| 6,710,908 | B2 | 3/2004 | Miles et al. | 2004/0217378 A1 | 11/2004 | Martin et al. |
| 6,741,377 | B2 | 5/2004 | Miles | 2004/0217919 A1 | 11/2004 | Pichl et al. |
| 6,741,384 | B1 | 5/2004 | Martin et al. | 2004/0218251 A1 | 11/2004 | Piehl et al. |
| 6,741,503 | B1 | 5/2004 | Farris et al. | 2004/0218334 A1 | 11/2004 | Martin et al. |
| 6,747,785 | B2 | 6/2004 | Chen et al. | 2004/0218341 A1 | 11/2004 | Martin et al. |
| 6,747,800 | B1 | 6/2004 | Lin | 2004/0227493 A1 | 11/2004 | Van Brocklin et al. |
| 6,750,152 | B1 | 6/2004 | Christenson et al. | 2004/0240032 A1 | 12/2004 | Miles |
| 6,753,528 | B1 | 6/2004 | Nikoonahad et al. | 2004/0240138 A1 | 12/2004 | Martin et al. |
| 6,763,702 | B2 * | 7/2004 | Chien et al. ................ 73/40.7 | 2004/0245588 A1 | 12/2004 | Nikkel et al. |
| 6,775,174 | B2 | 8/2004 | Huffman et al. | 2004/0263944 A1 | 12/2004 | Miles et al. |
| 6,778,155 | B2 | 8/2004 | Doherty et al. | 2005/0001828 A1 | 1/2005 | Martin et al. |
| 6,794,119 | B2 | 9/2004 | Miles | 2005/0003667 A1 | 1/2005 | Lin et al. |

| | | | |
|---|---|---|---|
| 2005/0024557 A1 | 2/2005 | Lin | |
| 2005/0035699 A1 | 2/2005 | Tsai | |
| 2005/0036095 A1 | 2/2005 | Yeh et al. | |
| 2005/0036192 A1 | 2/2005 | Lin et al. | |
| 2005/0038950 A1 | 2/2005 | Adelmann | |
| 2005/0042117 A1 | 2/2005 | Lin | |
| 2005/0046922 A1 | 3/2005 | Lin et al. | |
| 2005/0046948 A1 | 3/2005 | Lin | |
| 2005/0057442 A1 | 3/2005 | Way | |
| 2005/0068583 A1 | 3/2005 | Gutkowski et al. | |
| 2005/0068605 A1 | 3/2005 | Tsai | |
| 2005/0068606 A1 | 3/2005 | Tsai | |
| 2005/0069209 A1 | 3/2005 | Damera-Venkata et al. | |
| 2005/0078348 A1 | 4/2005 | Lin | |
| 2005/0168849 A1 | 8/2005 | Lin | |
| 2005/0195462 A1 | 9/2005 | Lin | |
| 2005/0202649 A1 | 9/2005 | Hung et al. | |
| 2005/0223779 A1* | 10/2005 | Perkins et al. | 73/40.7 |
| 2005/0249966 A1 | 11/2005 | Tung et al. | |
| 2006/0066935 A1 | 3/2006 | Cummings et al. | |

FOREIGN PATENT DOCUMENTS

| | | |
|---|---|---|
| DE | 19525081 | 1/1997 |
| EP | 498434 A1 * | 8/1992 |
| EP | 0 566 500 | 10/1993 |
| EP | 1065645 | 1/2001 |
| FR | 2516785 | 5/1983 |
| GB | 1 293 569 | 10/1972 |
| GB | 2030721 | 4/1980 |
| JP | 01259243 | 1/1990 |
| JP | 3002540 A | 1/1991 |
| JP | 11 337412 | 3/2000 |
| WO | WO 95/030924 | 11/1995 |
| WO | WO 97/017628 | 5/1997 |
| WO | WO 99/052006 A2 | 10/1999 |
| WO | WO 99/052006 A3 | 10/1999 |
| WO | WO 01/69310 A1 | 9/2001 |
| WO | WO 02/093116 A1 | 11/2002 |
| WO | WO 03/007049 A1 | 1/2003 |
| WO | WO 03/069413 A1 | 8/2003 |
| WO | WO 03/073151 A1 | 9/2003 |
| WO | WO 2004/006003 A1 | 1/2004 |
| WO | WO 2004/025239 A2 | 3/2004 |
| WO | WO 2004/026757 A2 | 4/2004 |
| WO | WO 2005/001410 A1 | 1/2005 |

OTHER PUBLICATIONS

Akasaka, "Three-Dimensional IC Trends," Proceedings of IEEE, vol. 74, No. 12, pp. 1703-1714 (Dec. 1986).

Aratani et al., "Process and Design Considerations for Surface Micromachined Beams for a Tuneable Interferometer Array in Silicon," Proc. IEEE Micorelectromechanical Workshop, Fort Lauderdale, FL, pp. 230-235 (Feb. 1993).

Aratani et al., "Surface Micromachined Tuneable Interferometer Array," Sensors and Actuators, pp. 17-23 (1994).

Conner, "Hybrid Color Display Using Interference Filter Array," SID Digest, pp. 577-580 (1993).

Durr et al., "Reliability Test and Failure Analysis of Optical MEMS", Proceedings of the 9th International Symposium on the Physical and Failure Analysis of Integrated Circuits, pp. 201-206, (Jul. 8-12, 2002).

Goossen et al., "Possible Display Applications of the Silicon Mechanical Anti-Reflection Switch," Society for Information Display (1994).

Goossen et al., "Silicon Modulator Based on Mechanically-Active Anti-Reflection Layer with 1Mbit/sec Capability for Fiber-in-the-Loop Applications," IEEE Photonics Technology Letters (Sep. 1994).

Gosch, "West Germany Grabs the Lead in X-Ray Lithography," Electronics, pp. 78-80 (Feb. 5, 1987).

Harpster Timothy J et al., "A Passive Humidity Monitoring System for In Situ Remotw Wireless Testing of Micropackages," J Microelectromech Syst. vol. 11, No. 1, p. 61-67, (2002).

Howard et al., "Nanometer-Scale Fabrication Techniques," VLSI Electronics: Microstructure Science, vol. 5, pp. 145-153 and pp. 166-173 (1982).

Jackson, "Classical Electrodynamics," John Wiley & Sons Inc., pp. 568-573 (date unknown).

Jerman et al., "A Miniature Fabry-Perot Interferometer," IEEE Electron Devices Society (1988).

Johnson "Optical Scanners," Microwave Scanning Antennas, vol. 1, pp. 251-261 (1964).

Light over Matter, Circle No. 36 (Jun. 1993).

Miles, "A New Reflective FPD Technology Using Interferometric Modulation," Society for Information Display '97 Digest, Session 7.3.

Miles, "Interferometric Modulation:MOEMS as an Enabling Technology for High-Perfomorance Reflective Displays," Proceedings of the SPIE, vol. 4985, p. 131-139. (2003).

Miles et al., "Digital Paper™ for Reflective Displays," J. of the Society for Information Display Soc. Inf. Display USA. vol. 11, No. 1, p. 209-215. (2003).

Newsbreaks, "Quantum-trench devices might operate at terahertz frequencies," Laser Focus World (May 1993).

Oliner et al., "Radiating Elements and Mutual Coupling," Microwave Scanning Antennas, vol. 2, p. 131-194 (1966).

Raley et al., "A Fabry-Perot Microinterferometer for Visible Wavelengths," IEEE Solid-State Sensor and Actuator Workshop, Hilton Head, SC (1992).

"Reflection/backscattering Probes," Ocean Optics, Inc, Internet Article, p. 1-3. XP-002358482. URL:http://web.archive.org/web/20040619022333/www.oceanoptics.com/products/reflectionprobes.asp>retrieved on Jun. 19, 2004.

Roveti, "Choosing a Humidity Sensor: A Review of Three Technologies" http://www.sensorsmag.com.articles/0701/54/main.shtml, (published prior to Sep. 17, 2004).

Skaggs et al, "Automatic Testing of the Digital Micromirror Device", IEEE/LEOS 1996 Summer Topical Meetings, pp. 11-12, (Aug. 5-9, 1996).

Sperger et al., "High-Performance Patterned All-Dielectric Interference Colour Filter for Display Applications," SID Digest, pp. 81-83 (1994).

Stone, "Radiation and Optics, An Introduction to the Classical Theory," McGraw-Hill, pp. 340-343 (1963).

Tabata et al., "In Situ Observation and Analysis of Wet Etching Process for Micro Electro-mechanical systems," Proc. Of the Workshop on Micro Electro Mechanical Systems. vol. Workshop 4. p. 99-102, (1991).

Walker, et al., "Electron-beam-tunable Interference Filter Spatial Light Modulator," Optics Letters vol. 13, No. 5, pp. 345-347 (May 1988).

Waelti M. et al., "Package Quality Testing Using Integrated Pressure Sensor," Proc. Of the SPIE, vol. 3582, p. 981-986, (1998).

Winton, John M., "A novel way to capture solar energy," Chemical Week, pp. 17-18 (May 15, 1985).

Wu, "Design of a Reflective Color LCD Using Optical Interference Reflectors," ASIA Display '95, pp. 929-931 (Oct. 16, 1995).

Austrian Search Report No. 74/2005, mailed on May 10, 2005.

Drieenhuizen, et al., "Comparison of Techniques for measuring Both Compressive and Tensile Stress in Thin Films." *Sensors and Actuators*, vol. 37-38, pp. 759-765. (1993).

Guckel et al., "Fine-Grained Polysilicon Films with Built-In Tensile Strain," *IEEE Transactions on Electron Devices*, vol. 35, No. 6, pp. 801-802, (1988).

"High-reflectivity Specular Reflectance standard," [Online] XP002374849, (URL:http://web.archive.org/web/20040220134330/www.oceanoptics.com/products/stan.ss1.asp> (retrieved on Feb. 20, 2004).

Lin et al., "A Micro Strain Gauge with Mechanical Amplifier," *J. of Microelectromechanical Systems*, vol. 6, No. 4, (1997).

"Low-reflectivity Specular Reflectance Standard," Internet Article, XP002374848 <URL:http://web.archive.org/web/20040220134257/www.oceanoptics.com/Productsstan.ss1.asp> (retrieved on Feb. 20, 2004).

Pruessner et al., "Mechanical Property Measurement of InP-based MEMS for optical communications," *Sensors and Actuators*, vol. 105, pp. 190-200, (2003).

"S2000 Miniature Fiber Optic Spectrometer", Internet Article, XP002358483, pp. 1-2, <URL:http://web.archive.org/web/20040617035842/www.oceanoptics.com/products/s2000.asp> (Retrieved Jun. 17, 2004).

Singh et al., "Strain Studies in LPCVD Polysilicon for Surface Micromachined Devices," *Sensors and Actuators*, vol. 77, pp. 133-138, (1999).

Srikar et al., "A Critical Review of Microscale Mechanical Testing Methods Used in the Design of Microelectromechanical Systems," *Society for Experimental mechanics*, vol. 43, No. 3, (2003).

Zhang, et al., "Measurements of Residual Stresses in Thin Films Using Micro-Rotating-Structures." *Thin Solid Films*, vol. 335, pp. 97-105, (1998).

Extended European Search Report for App. No. 05255672.7.

Dokmeci, et al. *A High-Sensitivity Polyimide Capacitive Relative Humidity Sensor for Monitoring Anodically Bonded Hermetic Micropackages* Journal of Microelectromechanical Systems, vol. 10, No. 2, Jun. 2001, 197-204.

Jin, et al. *"MEMS Vacuum Packaging Technology and Applications"* Electronics Packaging Technology, 2003, 5th Conference, Dec. 10-12, 2003, Piscataway, NJ, pp. 301-306.

Tominette, et al, Moisture and Impurities Detection and removal in Packaged MEMS, proceeding of SPIE vol. 4558, (2001), pp. 215-225.

\* cited by examiner

|  | +$V_{bias}$ | -$V_{bias}$ |
|---|---|---|
| -ΔV | Actuate | Release |
| 0 | Stable | Stable |
| +ΔV | Release | Actuate |

Column Output Signals (columns); Row Output Signals (rows)

METHOD AND SYSTEM FOR DETECTING LEAK IN ELECTRONIC DEVICES

RELATED APPLICATION

This application claims the benefit of earlier filing date of U.S. Provisional Application No. 60/613,385 filed Sep. 27, 2004, which is hereby incorporated herein by reference in its entirety.

BACKGROUND

1. Field of Technology

The disclosure relates to microelectromechanical systems (MEMS), and more particularly to detection of leaks in microelectromechanical systems (MEMS).

2. Description of the Related Technology

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. An interferometric modulator may comprise a pair of conductive plates, one or both of which may be transparent and/or reflective in whole or part and capable of relative motion upon application of an appropriate electrical signal. One plate may comprise a stationary layer deposited on a substrate, the other plate may comprise a metallic membrane separated from the stationary layer by an air gap.

Such devices have a wide range of applications, and it would be beneficial in the art to utilize and/or modify the characteristics of these types of devices so that their features can be exploited in improving existing products and creating new products that have not yet been developed. In designing commercial products utilizing this MEMS technology, packaging is developed in consideration of the requirements of cost, reliability and manufacturability.

SUMMARY

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

One embodiment comprises a method of detecting a leak in an electronic device. According to the method, an electronic device to be tested has an interior space. The electronic device is substantially free of a test gas and placed in a test gas environment comprising the test gas. Thereafter the electronic device is placed in a non-test gas environment substantially free of the test gas. The method then detects the test gas while the electronic device is placed in the non-test gas environment.

Another embodiment comprises a method of detecting a leak in an electronic device. According to the method, an electronic device is maintained in a filling chamber containing a test gas. At this time, the electronic device is substantially free of a gas. The electronic device is then transferred into an inspection chamber substantially free from the test gas. The method then detects the test gas existing in the inspection chamber while maintaining the electronic device in the inspection chamber.

Another embodiment comprises a method of detecting a leak in an electronic device. According to the method an electronic device is provided in a chamber. A test gas is supplied to the chamber to create a test gas environment within the chamber. Thereafter, the test gas is flushed out of the chamber and a non-test gas is supplied to the chamber to create a non-test gas environment within the chamber. Then the method detects the test gas existing in the non-test gas environment.

Still another embodiment comprises an electronic device inspected by at least one of the above-described method of detecting a leak.

A further embodiment comprises a system for testing an electronic device for leakage. The system comprises a filling chamber, an inspection chamber and a test gas sensor. The filling chamber is connected to a supply of a test gas so as to create a test gas environment therein. The inspection chamber is connected to a supply of a non-test gas so as to create a non-test gas environment therein. The inspection chamber is not connected to a supply of the test gas. The test gas sensor is connected the inspection chamber and configured to detect the test gas existing in the inspection chamber or flowing out of the inspection chamber.

A further embodiment comprises a system for testing an electronic device for leakage. The system comprises a test chamber, a supply of a test gas, a supply of a non-test gas and a test gas sensor. The supply of a test gas is connected to the test chamber and is configured to supply the test gas into the test chamber. The supply of a non-test gas is connected to the chamber and is configured to supply the non-test gas into the test chamber. The test gas sensor is connected to the test chamber and is configured to detect the test gas existing in the test chamber or flowing out of the inspection chamber.

A still further embodiment comprises a system for testing an electronic device for leakage. The system comprises means for providing a test gas environment, which comprises a test gas. The system further comprises means for creating a non-test gas environment that is substantially free of the test gas. The system further comprises means for detecting the test gas when a device under test is in the non-test gas environment.

DETAILED DESCRIPTION OF CERTAIN EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the invention may be implemented in any device that is configured to display an image, whether in motion (e.g., video) or stationary (e.g., still image), and whether textual or pictorial. More particularly, it is contemplated that the invention may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Various embodiments are directed to leak detection testing for packaged electronic devices. A test gas is allowed to diffuse into an electronic device under a non-destructive condition, for example, neither in vacuum nor at high pressure. Then, the test gas is allowed to diffuse out of the electronic device again under a non-destructive condition, and the test gas is detected outside the electronic device. Alternatively, the test gas within the electronic device can be detected. With this technique, the leak can be detected without destroying the electronic device or any part thereof. The leak detection test can be utilized to qualify the packaging process and investigate any reliability failures. Also, the leak detection test may be used for quality control purposes.

Figure 1:
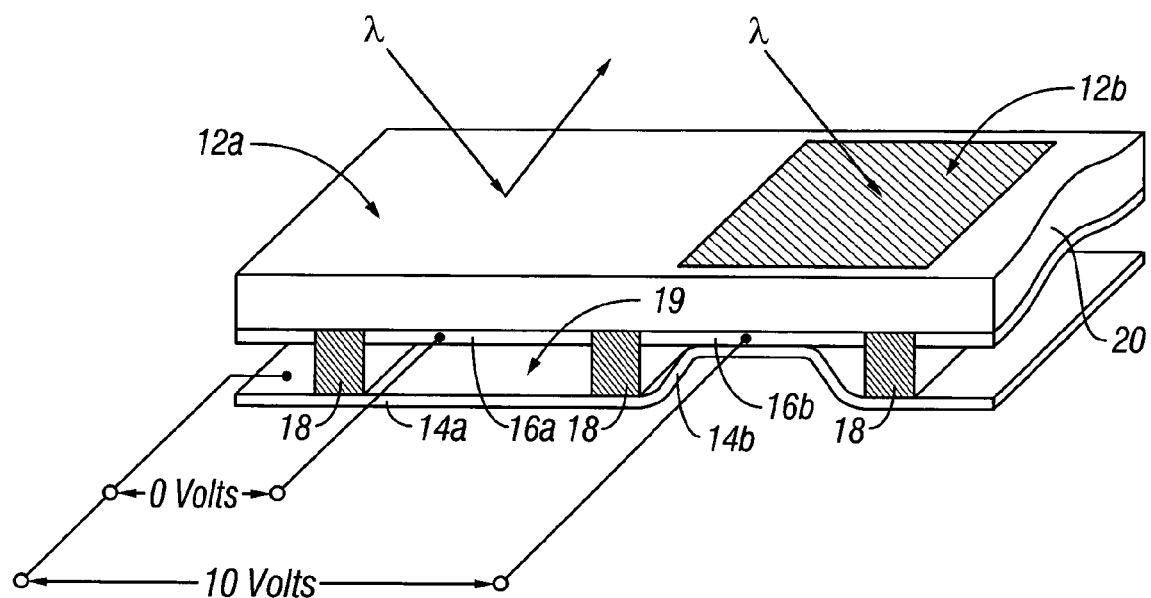
FIG. 1 is an isometric view depicting a portion of one embodiment of an interferometric modulator display in which a movable reflective layer of a first interferometric modulator is in a released position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the released state, the movable layer is positioned at a relatively large distance from a fixed partially reflective layer. In the second position, the movable layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable and highly reflective layer 14a is illustrated in a released position at a predetermined distance from a fixed partially reflective layer 16a. In the interferometric modulator 12b on the right, the movable highly reflective layer 14b is illustrated in an actuated position adjacent to the fixed partially reflective layer 16b.

The fixed layers 16a, 16b are electrically conductive, partially transparent and partially reflective, and may be fabricated, for example, by depositing one or more layers each of chromium and indium-tin-oxide onto a transparent substrate 20. The layers are patterned into parallel strips, and may form row electrodes in a display device as described further below. The movable layers 14a, 14b may be formed as a series of parallel strips of a deposited metal layer or layers (orthogonal to the row electrodes 16a, 16b) deposited on top of posts 18 and an intervening sacrificial material deposited between the posts 18. When the sacrificial material is etched away, the deformable metal layers are separated from the fixed metal layers by a defined air gap 19. A highly conductive and reflective material such as aluminum may be used for the deformable layers, and these strips may form column electrodes in a display device.

With no applied voltage, the cavity 19 remains between the layers 14a, 16a and the deformable layer is in a mechanically relaxed state as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable layer is deformed and is forced against the fixed layer (a dielectric material which is not illustrated in this Figure may be deposited on the fixed layer to prevent shorting and control the separation distance) as illustrated by the pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

Figure 2:
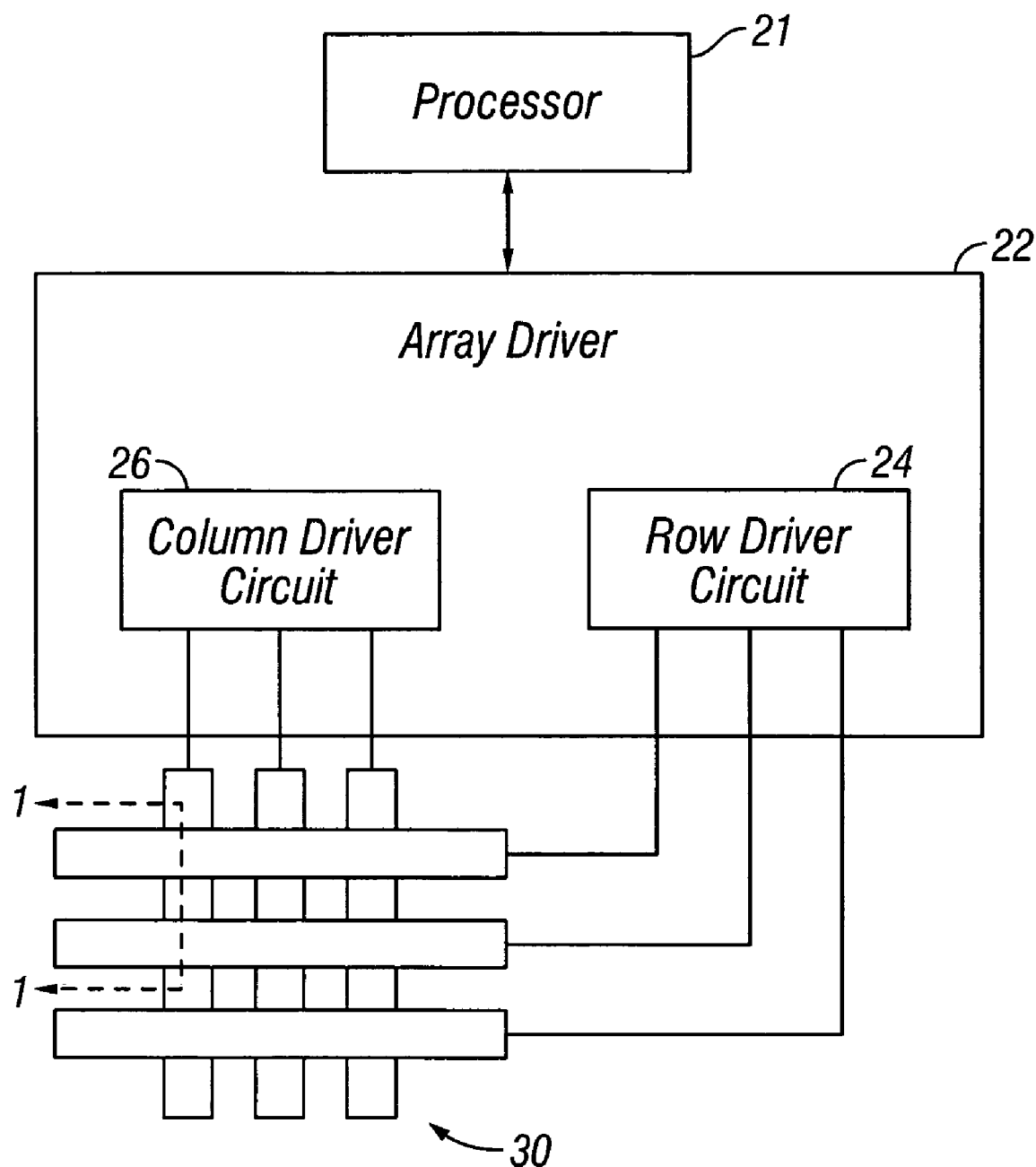
FIG. 2 is a system block diagram illustrating one embodiment of an electronic device incorporating a 3×3 interferometric modulator display.

FIGS. 2 through 5 illustrate one exemplary process and system for using an array of interferometric modulators in a display application. FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array controller 22. In one embodiment, the array controller 22 includes a row driver circuit 24 and a column driver circuit 26 that provide signals to a pixel array 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the released state to the actuated state. However, when the voltage is reduced from that value, the movable layer maintains its state as the voltage drops back below 10 volts. In the exemplary embodiment of FIG. 3, the movable layer does not release completely until the voltage drops below 2 volts. There is thus a range of voltage, about 3 to 7 V in the example illustrated in FIG. 3, where there exists a window of applied voltage within which the device is stable in either the released or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be released are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or released pre-existing state. Since each pixel of the interferometric modulator, whether in the actuated or released state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
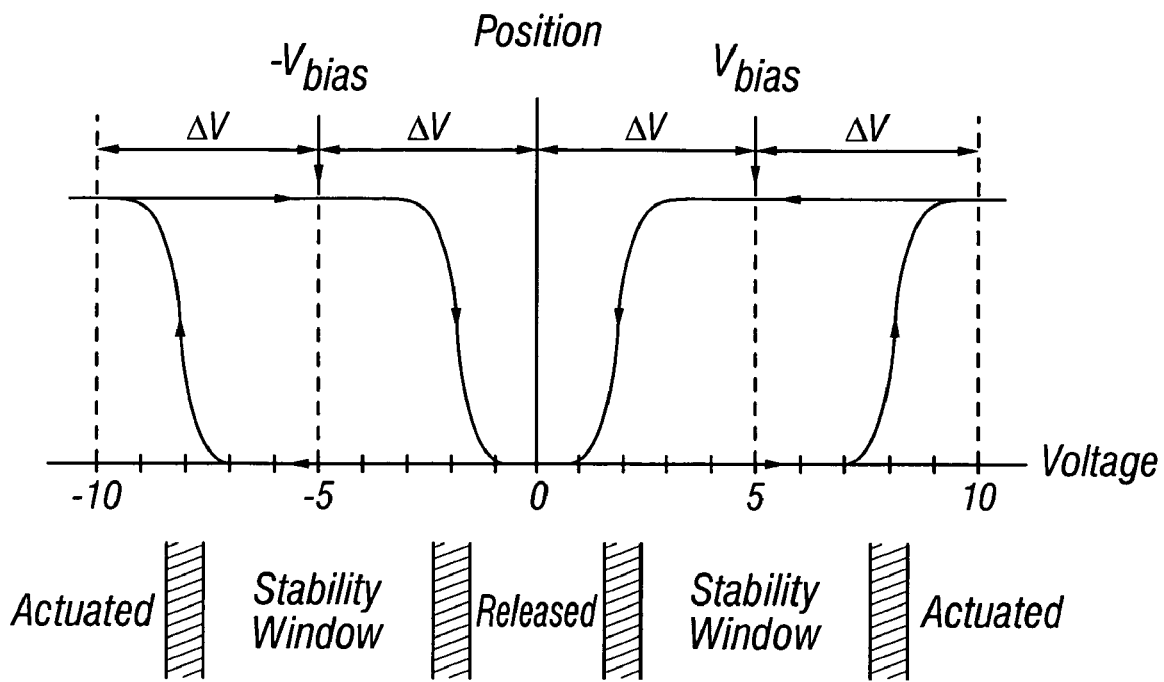
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to $-5$ volts and $+5$ volts respectively. Releasing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$.

Figure 5A:
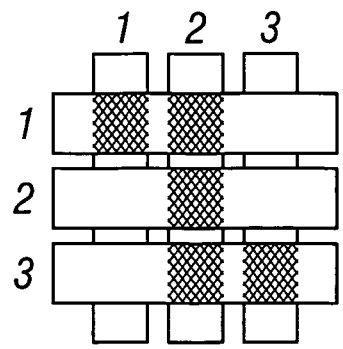
FIGS. 5A and 5B illustrate one exemplary timing diagram for row and column signals that may be used to write a frame of display data to the 3×3 interferometric modulator display of FIG. 2.
Figure 5B:
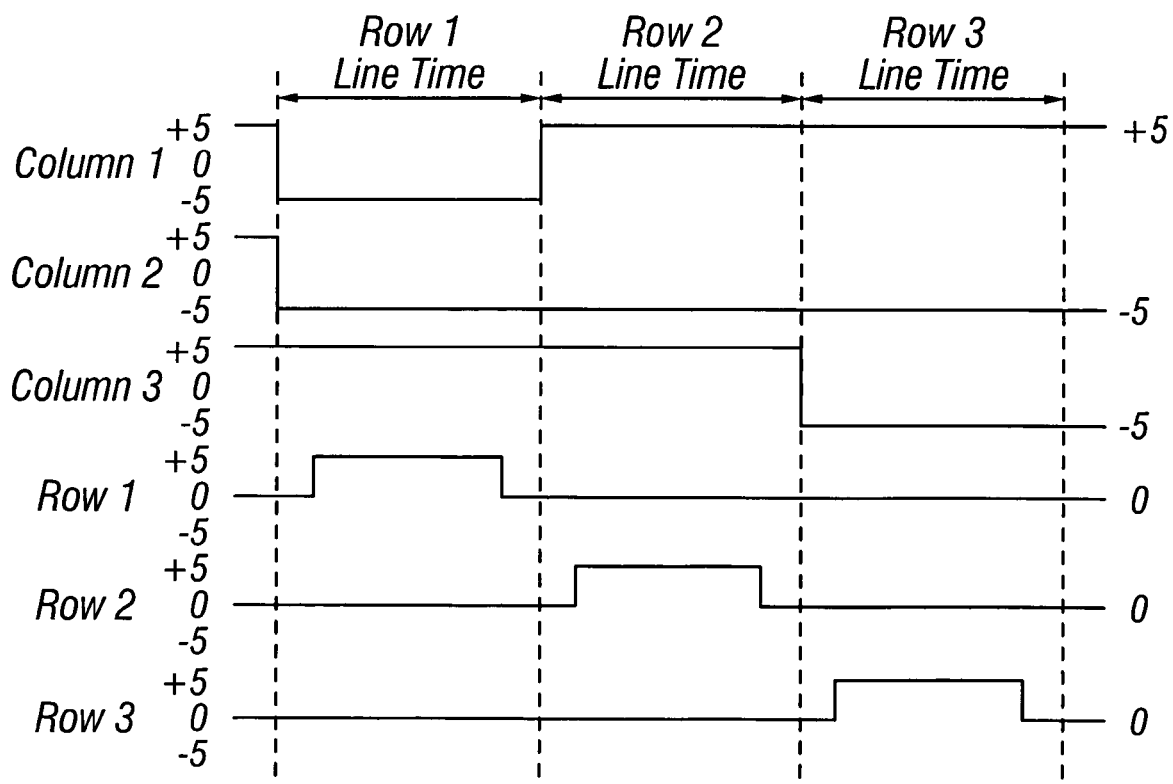

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or released states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and releases the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and release pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the present invention.

Figure 6A:
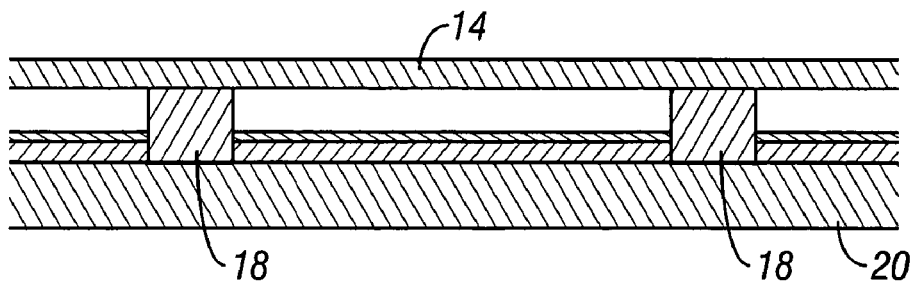
FIG. 6A is a cross section of the device of FIG. 1.
Figure 6B:
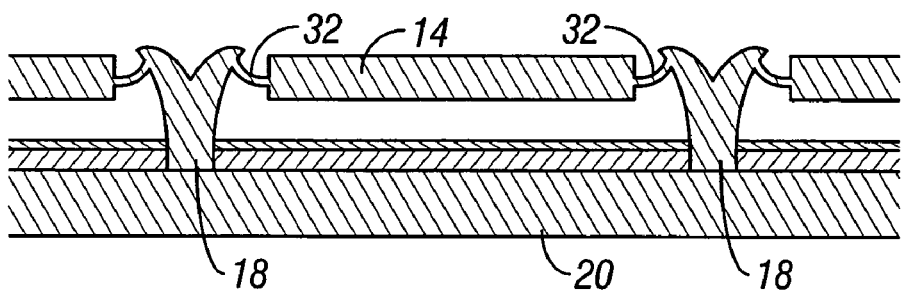
FIG. 6B is a cross section of an alternative embodiment of an interferometric modulator.
Figure 6C:
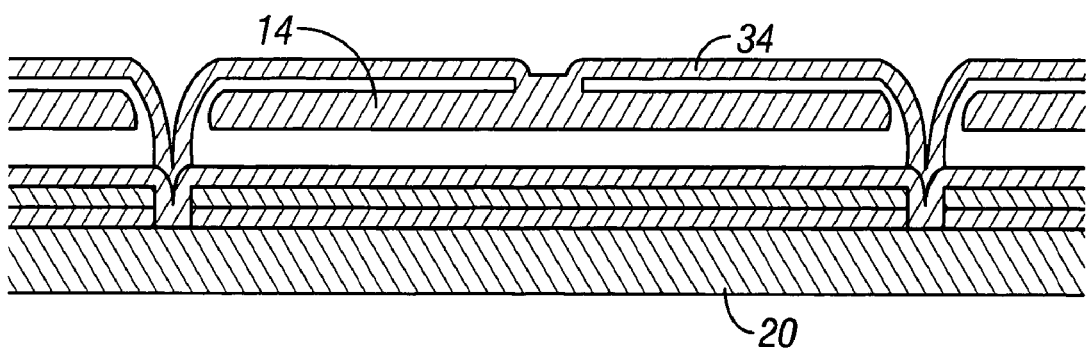
FIG. 6C is a cross section of another alternative embodiment of an interferometric modulator.

The details of the structure of interferometric modulators that operate in accordance with the principles set forth above may vary widely. For example, FIGS. 6A-6C illustrate three different embodiments of the moving mirror structure. FIG. 6A is a cross section of the embodiment of FIG. 1, where a strip of metal material 14 is deposited on orthogonally extending supports 18. In FIG. 6B, the moveable reflective material 14 is attached to supports at the corners only, on tethers 32. In FIG. 6C, the moveable reflective material 14 is suspended from a deformable layer 34. This embodiment has benefits because the structural design and materials used for the reflective material 14 can be optimized with respect to the optical properties, and the structural design and materials used for the deformable layer 34 can be optimized with respect to desired mechanical properties. The production of various types of interferometric devices is described in a variety of published documents, including, for example, U.S. Published Application 2004/0051929. A wide variety of well known techniques may be used to produce the above described structures involving a series of material deposition, patterning, and etching steps.

The MEMS technology does not require a moisture free condition. Thus, the packaging of the MEMS devices does not have to create such a moisture free condition within the package nor create a moisture barrier. Also, the MEMS device technology does not require special a filling gas or vacuum environment to insure the reliability of the operation of the MEMS devices. Nonetheless, it is advantageous to maintain a relatively low humidity within the package of the MEMS devices.

In light of the foregoing concerns, the packaging of the MEMS devices can be hermetically sealed, which means that substantially no water vapor may enter the packaged MEMS devices. In the alternative, a more practical packaging of the MEMS devices is to seal the device while allowing some water vapor permeation through the seal with a permeation rate which would not affect the reliability of the display operation during a desired life-time of the device. This approach of the permeable sealing may be combined with absorption of water vapor within the package by use of a desiccant.

Figure 7:
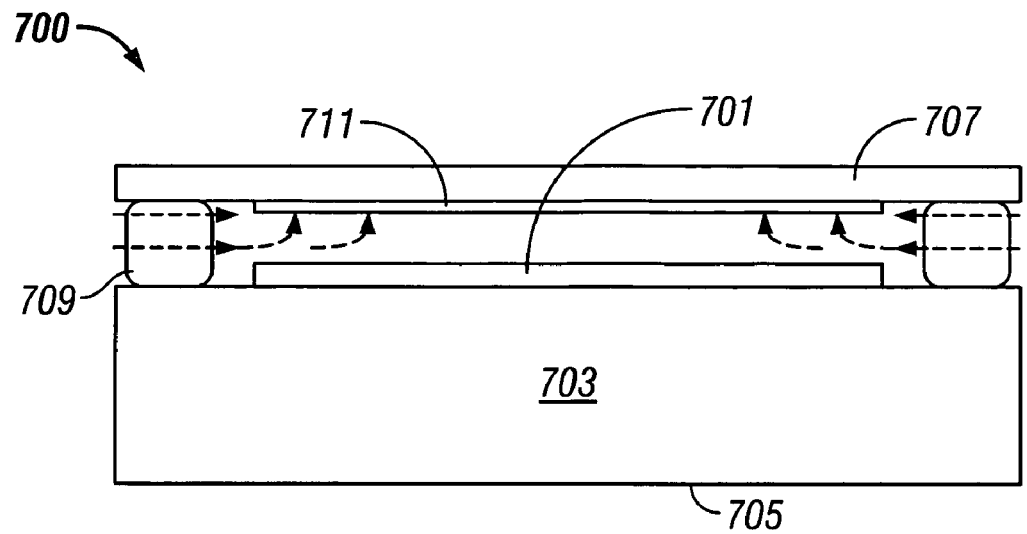
FIG. 7 is a side cross-sectional view illustrating a packaged MEMS device and permeation of water into the package.

FIG. 7 illustrates a cross-section of a typical packaging configuration of a MEMS device 700. On a substrate 703, a number of interferometric modulator elements are arranged to form a MEMS array 701. The substrate 703 corresponds to the transparent apparatus 20 of FIG. 1. The interferometric modulator elements comprise the interferometric modulators 12a and 12b of FIG. 1. Each interferometric modulator element includes two mirrors facing each other, creating an interferometric cavity therebetween as discussed above. One of the two mirrors is configured to change its position relative to the other mirror, thereby changing the depth of the cavity so as to control the display of colored light on a surface 705 of the substrate 703 by interferometric modulation.

A back-plate 707 is placed over the MEMS array 701. The back-plate 707 and the substrate 703 are connected to each other by a seal 709, which is sandwiched between the substrate 703 and the back-plate 707 about their periphery. In another embodiment, the back-plate 707 may be directly connected to the substrate 703 without an intervening seal. This configuration can be produced by, for example, depositing a sacrificial layer (not shown) over the MEMS array 701, depositing the back-plate 707 over the MEMS array 701, and removing the sacrificial layer. In the illustrated embodiment, a desiccant layer 711 is formed on an interior surface of the back-plate 707. The desiccant in the desiccant layer 711 absorbs water molecules and maintains a low humidity lever to insure proper operation of the interferometric modulator elements in the MEMS array 701. In another embodiment, no desiccant layer is formed.

As mentioned above, the seal 709 around the substrate 703 and the back-plate 707 may substantially hermetically seal the device 700. In this case, water molecules or vapor may not pass through the material of the seal 709. Alternatively, the seal 709 may allow a certain level of permeation of water vapor or molecules therethrough. In either approach, the device 700 could have one or more leaks for many reasons. A "leak" refers to an unintended crack or porosity in any of the walls or joints of the package that can allow diffusion of water vapor through it at a rate greater than a permissible permeation rate. Leaks allows diffusion of water molecules or vapor into the interior of the device 700 at a rate greater than the permitted permeation rate if the device 700 is placed in a humid condition. A sudden increase of humidity level inside the device 700 may interfere with the operation of MEMS elements. Also, the diffusion of water molecules may saturate the desiccant quickly and therefore the device 700 may fail earlier than its life expectancy.

Figure 8:
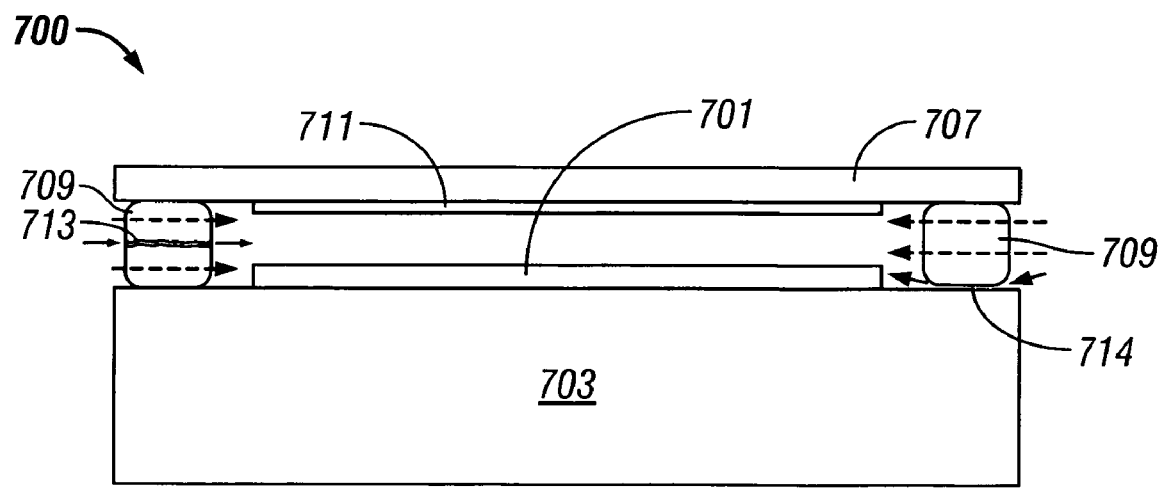
FIG. 8 is a side cross-sectional view illustrating a packaged MEMS device with leaks.

As illustrated in FIG. 8, leaks 713 and 714 may occur as cracks in the seal 709 itself or in an interface between the seal 709 and either of the substrate 703 and the back-plate 707, although not limited thereto. These leaks 713 and 714 may be created during the packaging process of the device 700 or by defects in the sealing materials. Various embodiments provide a leak detection test to qualify the packaging process and investigate any reliability failures. Also, the leak detection test may be used for quality control purposes.

Various embodiments provide leak detection testing methods and systems. In some embodiments, the leak detection tests are non-destructive tests, wherein the testing does not disassemble or break one or more parts of a device under test, and therefore after the testing the device is within the quality tolerance of the product unless it is found to have a defective leak. Subjecting a device to high pressure or vacuum may be considered destructive if a part of the device 700 is disfigured even if it is not broken. The leak detection tests can be conducted under a pressure above about 0.1, 0,2, 0.3, 0.4, 0.5, 0.6, 0.7, 0.8 or 0.9 atm, which is thus the lower limit of the pressure applied to a device under test. Also, the detection tests can be conducted under a pressure below about 1.1, 1.2, 1.3, 1.4, 1.5, 1.6, 1.7, 1.8, 1.9, 2, 2.1, 2.2, 2.3, 2.4, 2.5, 2.6, 2.7, 2.8, 2.9 or 3 atm, which is the upper limit of the pressure applied to a device under test. Thus, a device under test is subject to a pressure that falls within a pressure range defined by the combination of one of the lower limits and one of the upper limits during either or both of the filling and inspection stages, which will be discussed in detail.

Figure 9:
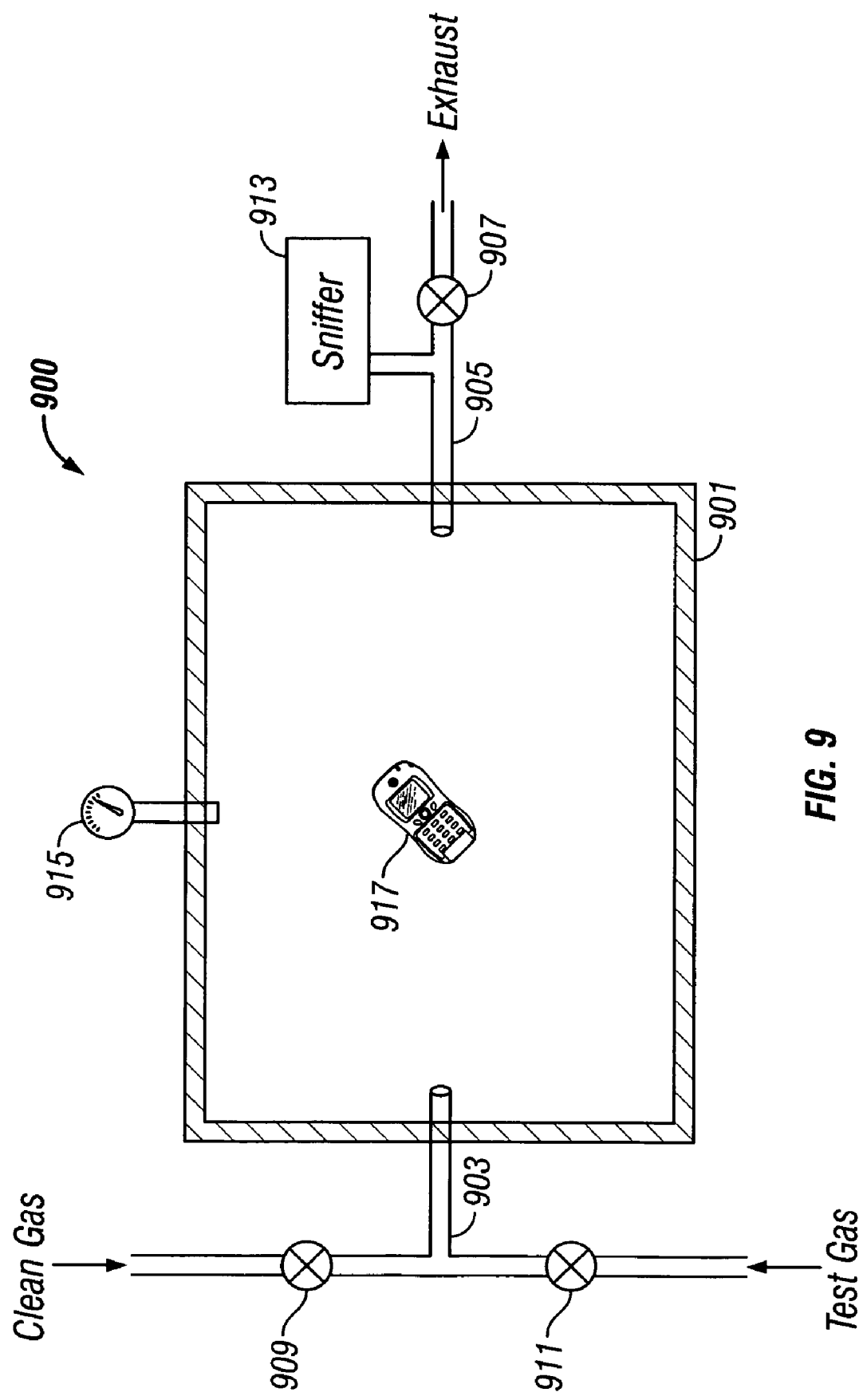
FIG. 9 is a system for a leak detection test according to an embodiment.

FIG. 9 illustrates a system 900 to conduct a testing for leak detection in accordance with one embodiment. The system 900 comprises a test chamber 901 having an inlet 903 and an outlet 905. The inlet 903 is connected to a clean gas supply via a clean gas control valve 909. The inlet 903 is also connected to a test gas supply via a test gas control valve 911. In the alternative, two separate gas supply inlets, one for clean gas and the other for test gas, may replace the inlet 903. The selection of the clean gas and test gas will be further discussed below in detail.

The outlet 905 is connected to an exhaust via an exhaust control valve 907. A sensor or sniffer 913 is connected to a passage of the outlet 905 and detects the test gas and/or measuring the concentration of the test gas existing in or flowing through the passage of the outlet 905. The sensor 913 has to be sensitive enough to detect a small amount of the test gas. For example, the sensitivity level of the sensor is about 0.1 to about 10 ppm. One of ordinary skill in the art will be able to choose an appropriate sensor available for use in the system 900. The sensor 913 may be connected to the test chamber 901 directly, instead of the passage of the outlet 905. Optionally, a pressure gauge 915 is connected to the test chamber 901 so as to monitor the pressure within the test chamber 901. The test chamber 901 may be substantially air-tightly sealed along the connections with various elements of the system 900.

Figure 10:
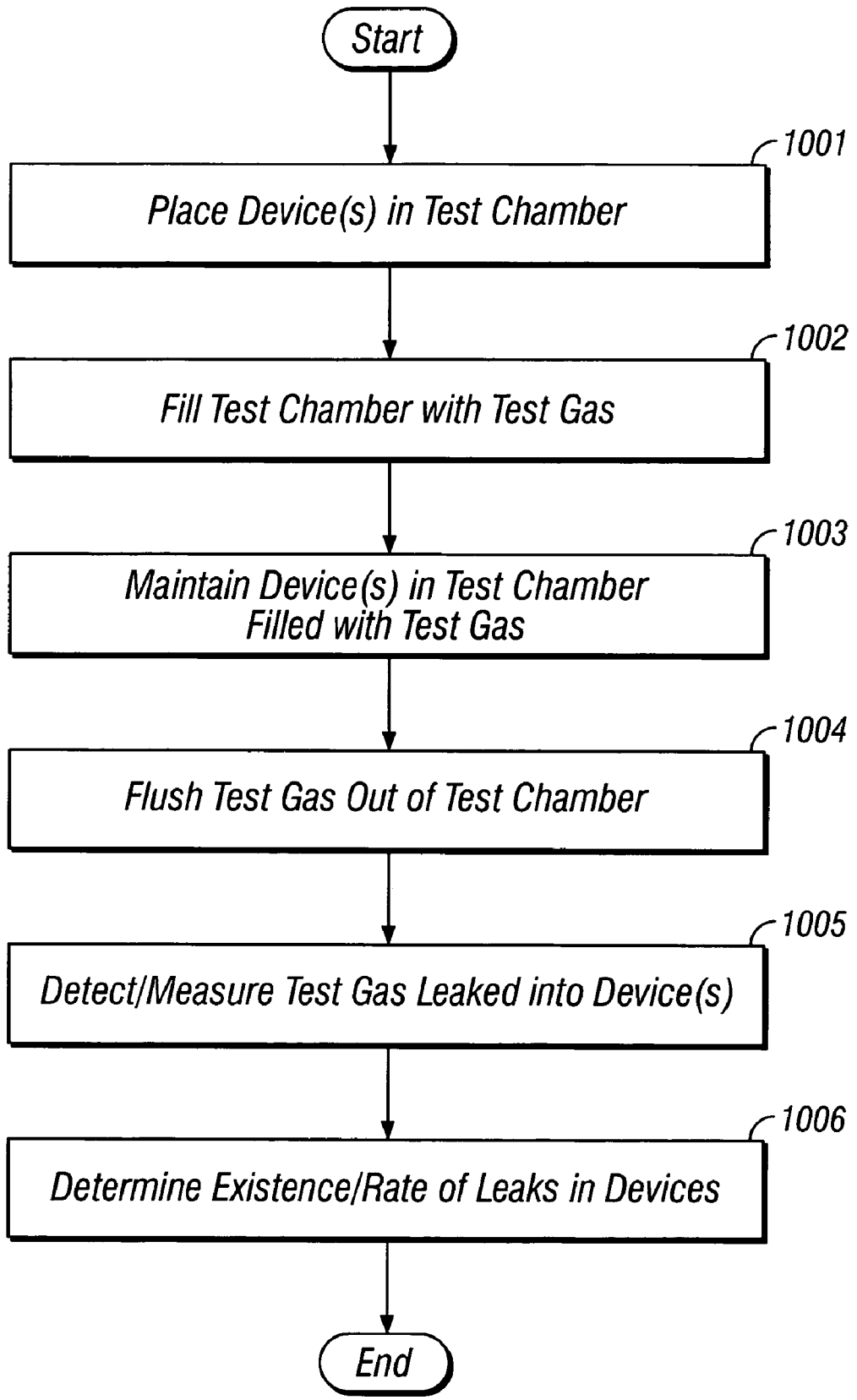
FIG. 10 is a flowchart of the test procedure utilizing the system of FIG. 9.

The operation of the system 900 is described with reference to the process flowchart shown in FIG. 10. Depending on the embodiments, additional steps may be added and/or some of the existing steps may be removed while the remaining steps are unchanged. Prior to step 1001, although not illustrated, the test chamber 901 may be cleaned, flushed or vacuumed. One of ordinary skill in the art will appreciate methods or processes available for cleaning, flushing or vacuuming the test chamber 901. In step 1001, a MEMS device 917 to be tested is placed in the test chamber 901 via an opening or door (not shown). The opening or door may be air-tightly sealed after placing the MEMS device 917 in step 1001 in a reversible manner, in which the air-tight sealing of the opening or door can be removed without damaging the test chamber 901 and/or the opening or door. One of ordinary skill in the art will appreciate techniques available for air-tight sealing of the door or opening in a reversible manner.

Continuing to step 1002, the test chamber 901 is filled with the test gas, for example, by opening the test gas control valve 911. In one embodiment, the exhaust control valve 907 may be opened too. The pressure of the flowing-in test gas may be adjusted such that the pressure would not destroy or disfigure any part of the device under test 917 as discussed earlier. A pressure destructive to the device 917 varies depending on the structural strength of the parts and connections of parts in the device. One of ordinary skill in the art will appreciate an appropriate pressure that is not destructive to the device 917. The test gas may be supplied to the test chamber 901 at about an atmospheric pressure although not limited thereto. The pressure of the flowing-in test gas may be from about 1.0 atm to about 1.5 atm. Furthermore, the pressure of the flowing-in test gas may be from about 1.1 to about 1.2.

Next at step 1003, the device 917 is maintained in the test chamber 901 filled with the test gas for a period of time. In one embodiment, the device 917 is maintained as long as possible so that the test gas can permeate or diffuse into the interior space of the device 917. Practically in order to reduce the time for a single testing, however, the time period may be from about 5 sec to about 3000 sec. In another embodiment, the time period may be from about 30 sec to about 300 sec. Furthermore, the time period may be from about 60 sec to about 120 sec.

As an embodiment of maintaining the device 917 in the test chamber 901, the test gas control valve 911 and the exhaust control valve 907 may be closed after the test chamber 901 is filled with the test gas at a desired pressure in step 1002. Then, device 917 is maintained in that closed test chamber 901 for an appropriate period of time. In another embodiment, even after the test chamber 901 is filled with the test gas at a desired pressure in step 1002, the supply of the test gas to the test chamber 901 may be continued. In this embodiment, while the supply of the test gas is continued, the exhaust may also be continued so that the pressure within the test chamber 901 will not be built up to be destructive to the test device. In one embodiment the supply of the test gas to the test chamber 901 and the exhaust of the test gas from the test chamber may be continued in a substantially steady state for an appropriate period of time.

Prior to step 1004, the continuous supply and exhaust is stopped. In one embodiment, the pressure of the test gas may be from about 1.0 to about 1.5 atm. In another embodiment, the pressure is from about 1.1 to about 1.2 atm. The pressure may be maintained at a substantially constant level.

If the device 917 has one or more leaks 713 and 714 (FIG. 8) that allow diffusion of water molecules therethrough, the test gas will also diffuse into the inside of the device 917. The diffusion of the test gas into the inside of the device 917 is spontaneous since there is a concentration gradient of the test gas between the outside and inside of the device 917. Otherwise, the device 917 will still allow some permeation of the test gas into the interior thereof unless it is hermetically sealed.

Now moving to step 1004, the test gas filled in the test chamber 901 is flushed out of the chamber 901 through the outlet 905 while leaving the device 917 in the chamber 901. In one embodiment, the clean gas is supplied to the test chamber 901 while opening the exhaust control valve 907, thereby pushing the test gas out of the chamber 901 through the outlet 905. In one embodiment, the pressure of the supply of the clean gas may be adjusted such that the pressure would not destroy or disfigure any part of the device 917. As noted above, pressure destructive to the device 917 varies depending on the structural strength of the parts and connections of parts in the device. One of ordinary skill in the art will appreciate an appropriate pressure that is not destructive. The clean gas may be supplied to the test chamber 901 at about an atmospheric pressure although not limited thereto. In one embodiment, the pressure of the clean gas supplied to the test chamber is from about 1.0 atm to about 1.5 atm. In another embodiment, the pressure of the clean gas is from about 1.1 atm to about 1.2 atm. In still another embodiment, the test gas may be sucked through the outlet 905 by creating vacuum in the exhaust.

Next at step 1005, the sensor 913 detects the existence of the test gas and/or measures the absolute or relative amount of the test gas. In one embodiment, the sensor 913 may detect the test gas from the exhaust gas through the outlet 905 while continuously supplying the clean gas or without supplying the clean gas into the test chamber 901. In another embodiment, the sensor may detect the test gas from the test chamber 901 with the exhaust control valve 907 being closed. The operation of the sensor 913 may be carried out while continuously flowing the clean gas into the chamber and continuously flowing the gas existing in the chamber 901 out through the outlet 905 with both of the clean gas control valve 909 and the exhaust control valve 907 open. The operation of the sensor 913 may be carried out in a steady state condition, which means that the flow rates at the inlet 903 and outlet 905 are substantially the same.

At the beginning of the flushing of the test gas or soon thereafter in step 1004, there is reverse diffusion of the test gas from the inside of the device 917 to the outside of the device 917 if the device 917 has one or more leaks 713 and 714 (FIG. 8) and the test gas entered the inside through the leaks 713 and 714 during the filling and maintaining steps 1002 and 1003. Again, the diffusion of the test gas from the inside of the device 917 to the outside is spontaneous as there is a concentration gradient of the test gas between the inside and outside of the device 917. Even if there is no leak in the device 917, there may be some noticeable reverse permeation of the test gas from the inside of the device 917 to the outside of the device if some of the test gas permeated into the inside during the filling and maintaining steps 402 and 403. The detection by the sensor 913 may start from the beginning of the flushing step 1004 or at a time after a while from the beginning of the flushing.

Proceeding to step 1006, the leakage characteristics of the device 917 can be determined based on the information obtained from the sensor 913. The leakage characteristics may include existence of a leak, the size of the leak, and the like. This determination may be conducted by a person or by an automated machine programmed to conduct such determination. The determination of the leakage characteristics will be discussed in greater detail below.

Figure 11:
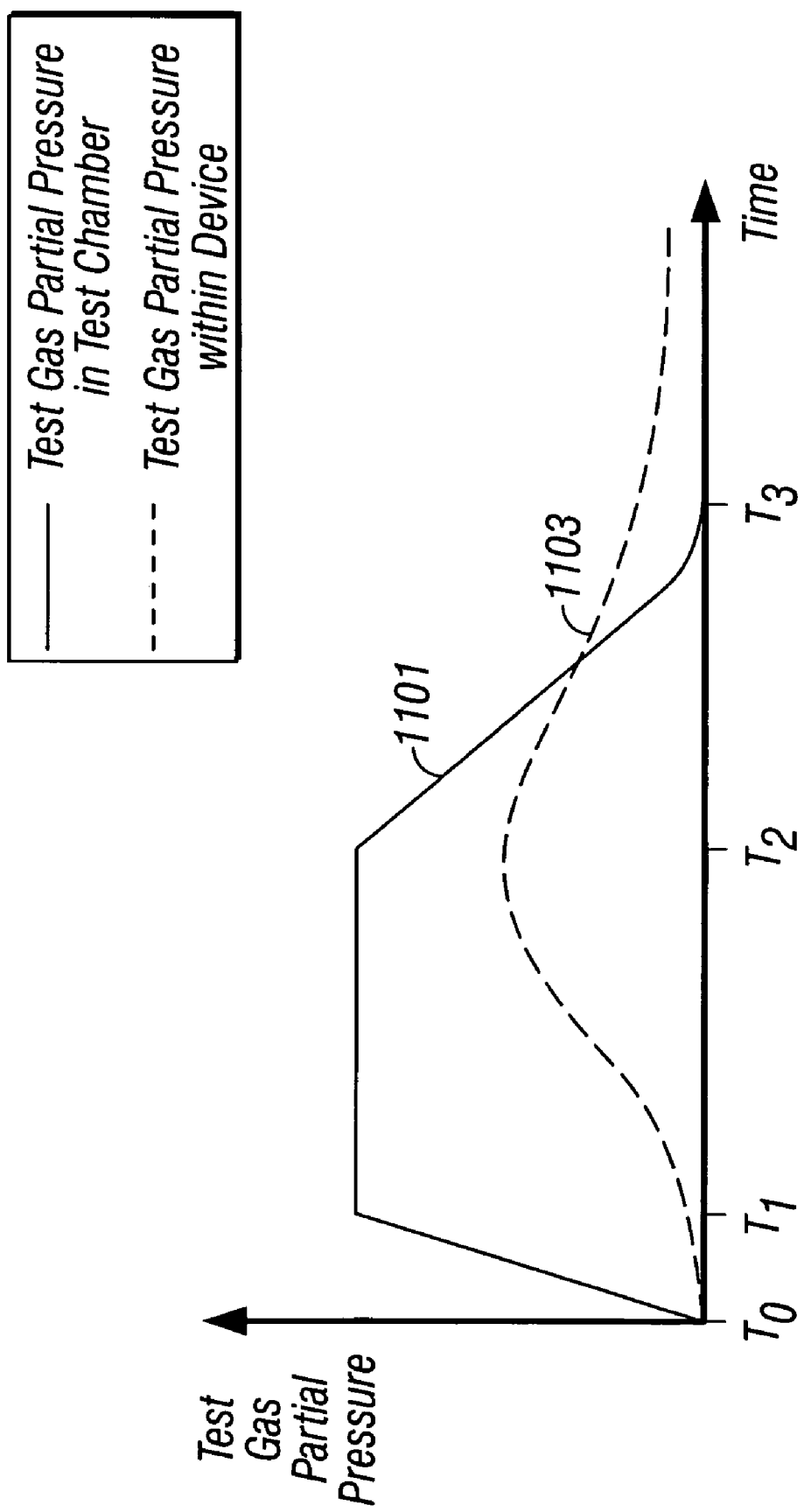
FIGS. 11-13 are graphs illustrating partial pressure profiles of a test gas in a device under test and a test chamber in a test utilizing the system of FIG. 9.

FIG. 11 illustrates exemplary profiles of the test gas pressure over time within the test chamber 901 and inside the device 917 illustrated in FIG. 9. The period from $T_0$ to $T_1$ generally corresponds to step 1002, i.e., filling the test chamber 901 with test gas. The period from $T_1$ to $T_2$ generally corresponds to step 1003, i.e., maintaining the device 917 in the chamber 901 filled with test gas. The period from $T_2$ to $T_3$ generally corresponds to step 1004, flushing the test gas out of the test chamber 901. The sensor operation may begin at $T_2$ or anytime afterward, although not limited thereto. The profile 1101 represents the partial pressure changes within the test chamber 901 created by supplying and flushing of the test gas in the test chamber 901. The profile 1103 represents the partial pressure changes within the device 917.

Figure 12A:
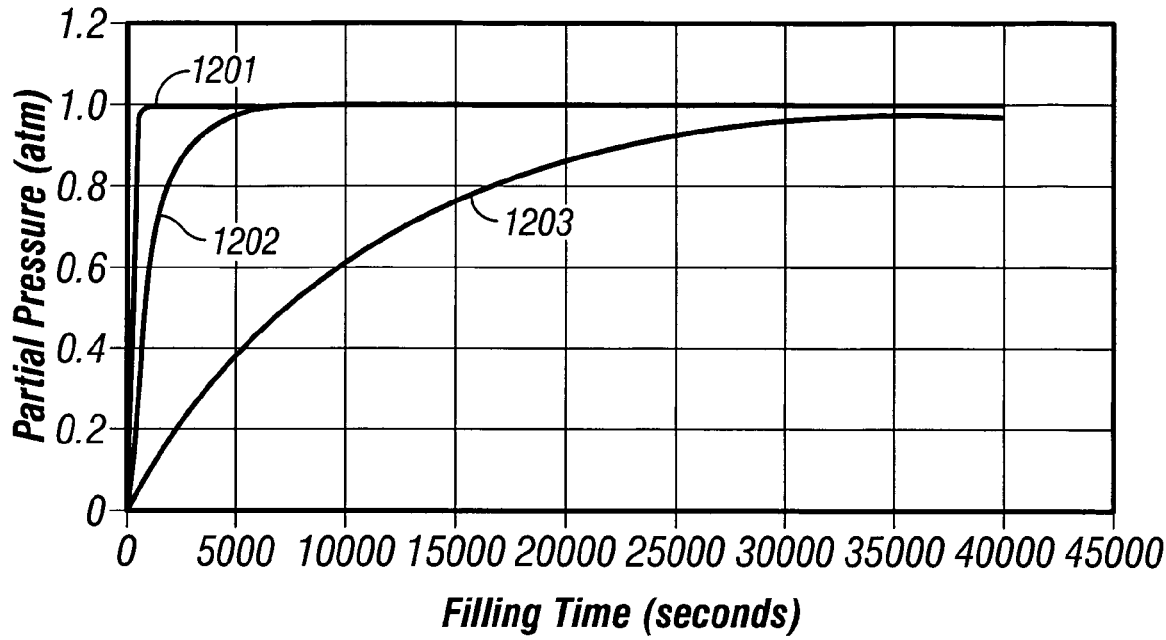

FIG. 12A illustrates exemplary partial pressure profiles of the test gas inside three sample devices having different leak rates during the filling time, i.e., from the beginning of filling the test chamber 901 with the test gas (step 1002) before the flushing of the test gas out of the test chamber 901 (step 1004). The curve 1201 represents a large leak rate (in the order of $10^{-3}$ atm-cc/sec or greater), which is large total leakage, which is interpreted as a single large leak or multiple smaller leaks. Because of the large leak rate, the test gas quickly diffuses into the inside of the device 917 upon supplying of the test gas to the test chamber 901. The curve 1203 represents a small leak rate (in the order of $10^{-5}$ atm-cc/sec or smaller). Because of the small leak rate, the partial pressure of the test gas inside the device increases slowly over time. The curve 1202 represents an intermediate leak rate (in the order of $10^{-4}$ atm-cc/sec).

Figure 12B:
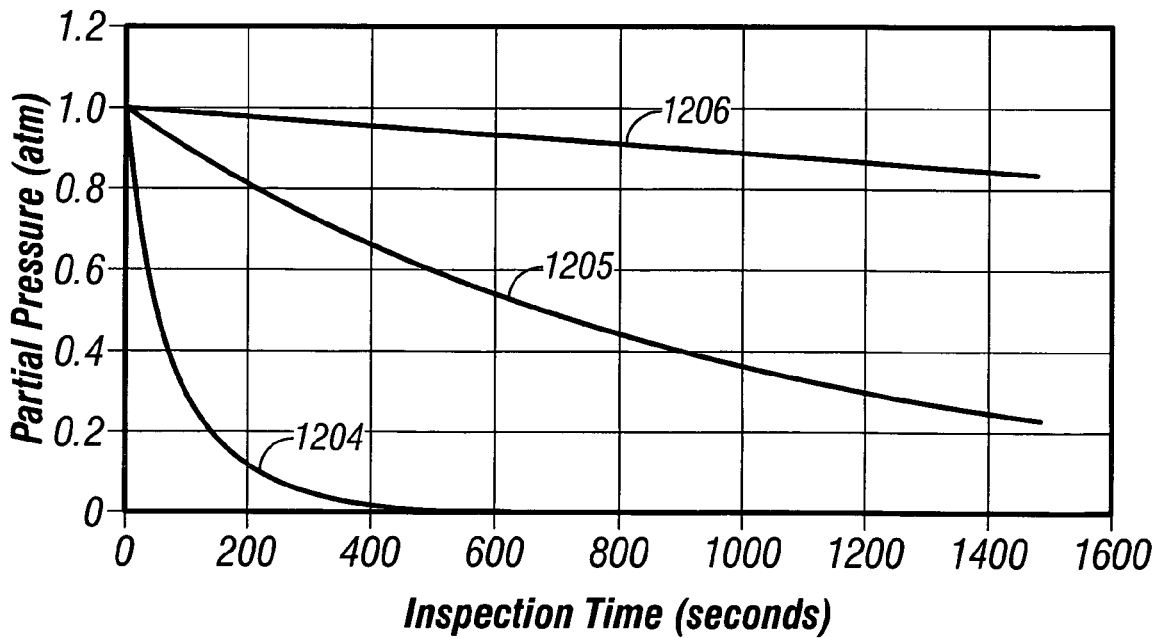

FIG. 12B illustrates exemplary partial pressure profiles of the test gas inside the three sample devices having different leak rates during the sensor operation time or inspection time, i.e., generally from the beginning of the flushing (step 1004). The curve 1204 represents a large leak rate (in the order of $10^{-3}$ atm-cc/sec or greater). When the test gas is flushed out of the test chamber 901, the test gas inside the device quickly diffuses out through the leaks 713 and 714. Thus, the partial pressure of the test gas inside the device quickly decreases. The curve 1206 represents a small leak rate (in the order of $10^{-5}$ atm-cc/sec or smaller), which is interpreted as a device having a small size of leak(s) 713 and 714. Because the total leakage is small, it takes a longer time for the test gas to diffuse out through the leak(s) 713 and 714. Thus, the partial pressure of the test gas inside the device decreases slowly, and accordingly the diffusion of the test gas out of the device takes a longer time. The curve 1205 represents an intermediate leak rate (in the order of $10^{-4}$ atm-cc/sec).

Figure 13A:
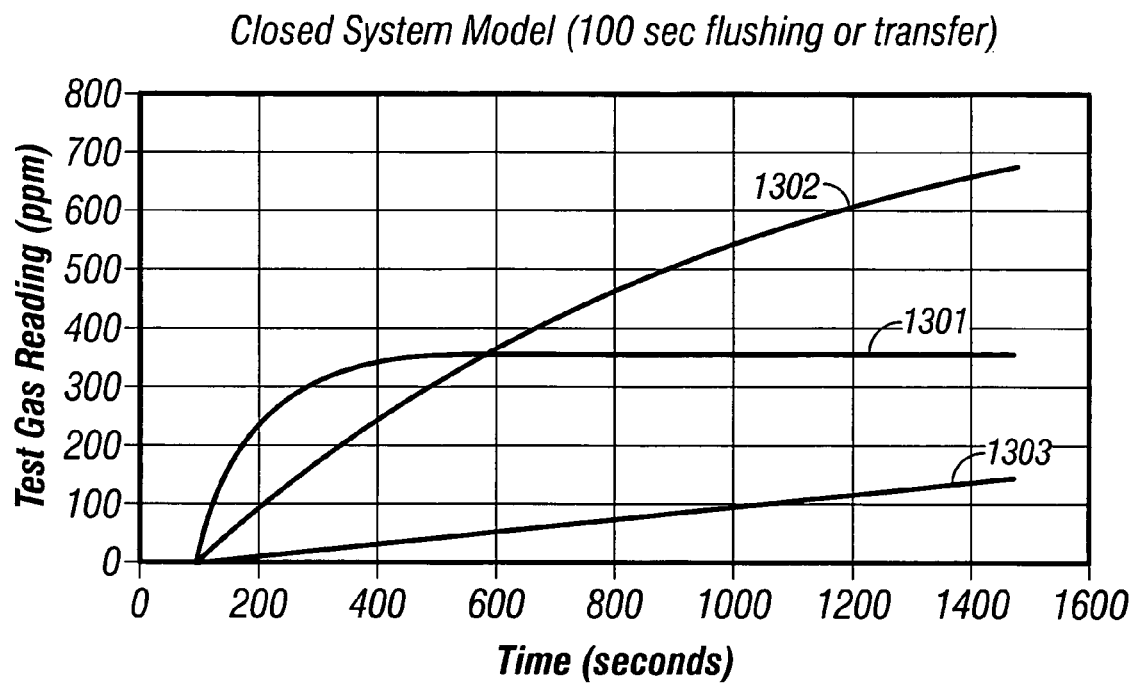
Figure 13B:
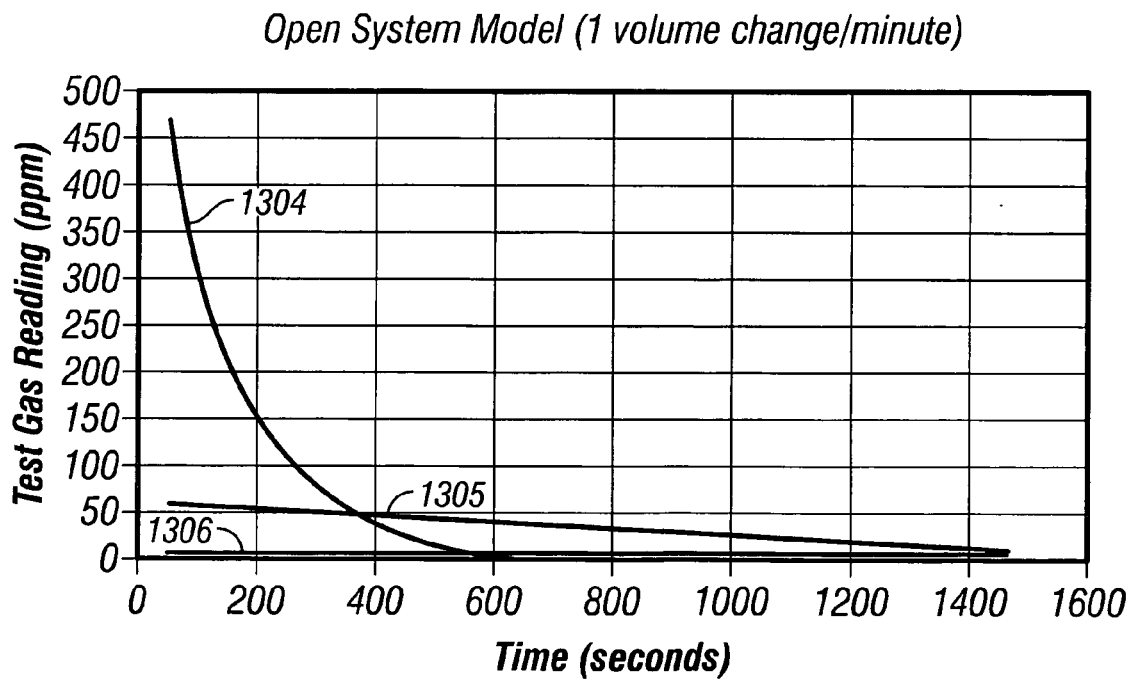

FIGS. 13A and 13B illustrate exemplary profiles of the amount of the test gas inside the test chamber 901 or at the exhaust thereof when the test chamber 901 is about 1000 times of the interior space of the device 917. In the graphs, it is assumed that the test gas does not exist in the test chamber 901 at the beginning of the inspection. FIG. 13A is a test gas concentration (ppm) profile in a closed system in which no gas is supplied into or exhausted out of the test chamber 901 during the inspection. The time starts (t=0) at the end of the filling of the device 917 and the inspection starts at 100 sec. The time up to 100 sec. corresponds to flushing the test gas out of the test chamber 901 and filling it with the clean gas. Alternatively, the time up to 100 sec. may correspond to transferring the device 917 to the inspection chamber 901b (FIG. 14) to be discussed below.

The curve 1301 represents a large leak rate (in the order of $10^{-3}$ atm-cc/sec or greater). When the test gas is flushed out of the test chamber 901, the test gas inside the device quickly diffuses out through the leaks. A significant amount of the test gas (about ⅔ in this model) leaks out of the device 917 during the time up to 100 sec. The remainder (⅓) of the test gas diffuses out of the device 917 still rapidly and therefore is saturated soon after beginning of the inspection. The curves 1302 and 1303 represent an intermediate leak rate (in the order of $10^{-4}$ atm-cc/sec) and a small leak rate (in the order of $10^{-5}$ atm-cc/sec or smaller), respectively. The curves 1302 and 1303 saturate at about 1000 ppm, although not illustrated.

FIG. 13B is a test gas concentration (ppm) profile in an open system in which the clean gas is continuously supplied into the test chamber 901 and the same amount of the gas is continuously exhausted during the inspection. The time starts (t=0) at the end of the filling of the device 917 and the inspection starts at 60 sec. The time up to 60 sec. corresponds to flushing the test gas out of the test chamber 901 and filling it with the clean gas. Alternatively, the time up to 60 sec. may correspond to transferring the device 917 to the inspection chamber 901b (FIG. 14) to be discussed below. The curve 1304 represents a large leak rate (in the order of $10^{-3}$ atm-cc/sec or greater). The test gas inside the device quickly diffuses out through the large leaks from beginning of the flushing or transferring. The concentration of the test gas in the test chamber 901 decreases rapidly in the large leak rate curve 1304 and the test gas is substantially depleted in the test chamber 901 at about 600 sec. The curves 1305 and 1306 represent an intermediate leak rate (in the order of $10^{-4}$ atm-cc/sec) and a small leak rate (in the order of $10^{-5}$ atm-cc/sec or smaller), respectively. The curve 1306 for the small leak rate stays slightly above zero throughout.

The sensor 913 can detect the concentration/partial pressure of the test gas. Also, the sensor can monitor the changes of the concentration/partial pressure of the test gas in the mixture of the test gas and the clean gas within the test chamber 901 or in the exhaust gas. The monitoring may be accomplished by continuously recording the readings of the sensor 913 in a recording system or machine. In some embodiments, the sensor 913 and its associated recording system (not shown) monitor the changes in the concentration and/or partial pressure of the test gas over time. In one embodiment, the monitoring begins from the time $T_2$, $T_3$ (FIG. 11) or any time between them. The monitoring continues for a time sufficient to determine the leakage characteristics. In another embodiment, the monitoring continues from $T_2$ and continues for about 200, 400, 600, 800, 1000, 1200 or 1400 seconds.

The data of the concentration and/or partial pressure changes monitored by the sensor 913 and its associated recording system are processed to determine the leakage characteristics of the device 917. For example, the data processing involves subtracting, from the monitored partial pressure (e.g., FIG. 13), a simulated partial pressure 1101 (e.g., FIG. 11) of the test gas within the test chamber 901 that can be created only by the supply and flushing of the test gas. The result of this subtraction is a partial pressure of the test gas that has been diffused or permeated out of the device 917. This result can be converted to a corresponding partial pressure inside the device 917, which is essentially the partial pressure plotted in FIG. 12B. All of the processing may be automated by computer software. One of ordinary skill in the art will be able to develop software to conduct this calculation and to determine the size of total leakage from the data collected by the sensor 913.

Following are exemplary conditions that may be used to determine a leak rate. The volume of the test chamber is much bigger than the interior space of the device 917, for example, about 1000:1. The time for filling the test gas and maintaining the device in the test gas ($T_0$ to $T_2$) is long enough for the test gas to reach equilibrium between the test chamber 901 and the inside of the device 917. In some embodiments, the test gas supplied into the chamber 901 is substantially pure such as purity over about 99%. The partial pressure of the test gas inside the device 917 immediately before flushing the test chamber 901 with the clean gas is close to 1 atm. Detecting the concentration of the test gas is performed fast enough compared to the leak rate of the device 917 so that the partial pressure of the test gas inside the device 917 does not change significantly during the detecting. The sensor 913 can accurately measure the test gas concentration in the ppm range. The test chamber 901 during the monitoring stage is not much bigger than the device 917, for example, about 10:1. The driving force for the test gas leaking out of the device 917 is about 1 atm because there is no test gas in the background gas in the test chamber during the monitoring stage. If the foregoing conditions are met, for example, the relationship between a test gas leak rate and a steady state reading of the concentration of the test gas is represented as below. One of ordinary skill in the art will appreciate one or more of the conditions that can be modified without significantly changing the equation.

Leak Rate (atm-cc/sec)=Concentration of Test Gas (ppm)×$10^{-6}$×Volume of Chamber=Concentration of Test Gas (ppm)×$10^{-5}$×Volume of Device under Test It is notable that if the device 917 has a large leak rate, for example, in the order of $10^{-5}$ atm-cc/sec or greater (1301 of FIG. 13), the leaking may not be readily detectable in a steady state condition. Since the leak rate is large, the test gas is diffused out of the device 917 during the flushing period (between $T_2$ and $T_3$ in FIG. 11), which is before the supply of the clean gas and the exhaust reach a steady state. However, if the monitoring is made in a no-flow closed condition with both the inlet 903 and outlet 905 closed, the amount of the test gas leaked out of the device 917 may be detected. Thus, if no noticeable leak characteristics are found in a steady state monitoring, a no-flow detection of the concentration/partial pressure of the test gas may be further conducted to determine whether the device has large leakage.

Turing to the choice of the test gas, it can be chosen from the gases that are not present while the device 917 is assembled. This is because if the test gas was present during the assembly process of the device 917, that gas may be contained inside the device 917 and would interfere accurate detection of the leakage in the device 917. Accordingly, a major component of air that may exist during the assembly process would not be appropriate for the test gas. The test gas may be a stable gas and is not reactive with air or other surfaces present in the MEMS device or leak testing equipment. The test gas may be inert, which means that it would not by itself damage the MEMS device or surfaces thereof.

Further, the test gas is chosen from the gases that are not reactive with a desiccant that may be contained in the device 917. Moreover, the test gas is chosen from the gases that stay in the gaseous phase at room temperature. For example, the gases satisfying the foregoing criteria are noble gases, including He, Ne, Ar, etc. and some halogen compounds including $SF_6$. In one embodiment, the test gas may be He as the molecule is very small and can go through very small leaks. The test gas is chosen from the gases that are similar in size to a water molecule, because the MEMS devices are most sensitive to a water vapor leak.

In one embodiment, the test gas can be supplied to the test chamber 901 with one or more other gases in the form of a gaseous composition. Although the test gas is supplied with other gases, the gradient in the partial pressure of only the test gas between the inside and outside of the device 917 affect the diffusion of the test gas into and out of the device 917. Also, the sensor 913 can detect the partial pressure and/or concentration of the test gas only, not those of the other component gases.

The clean gas is any gas other than the test gas or a mixture of gases that do not contain the test gas. The clean gas is stable and is not reactive with the test gas. In some embodiments, the clean gas is, for example, $N_2$, Ar, dry filtered air.

Figure 14:
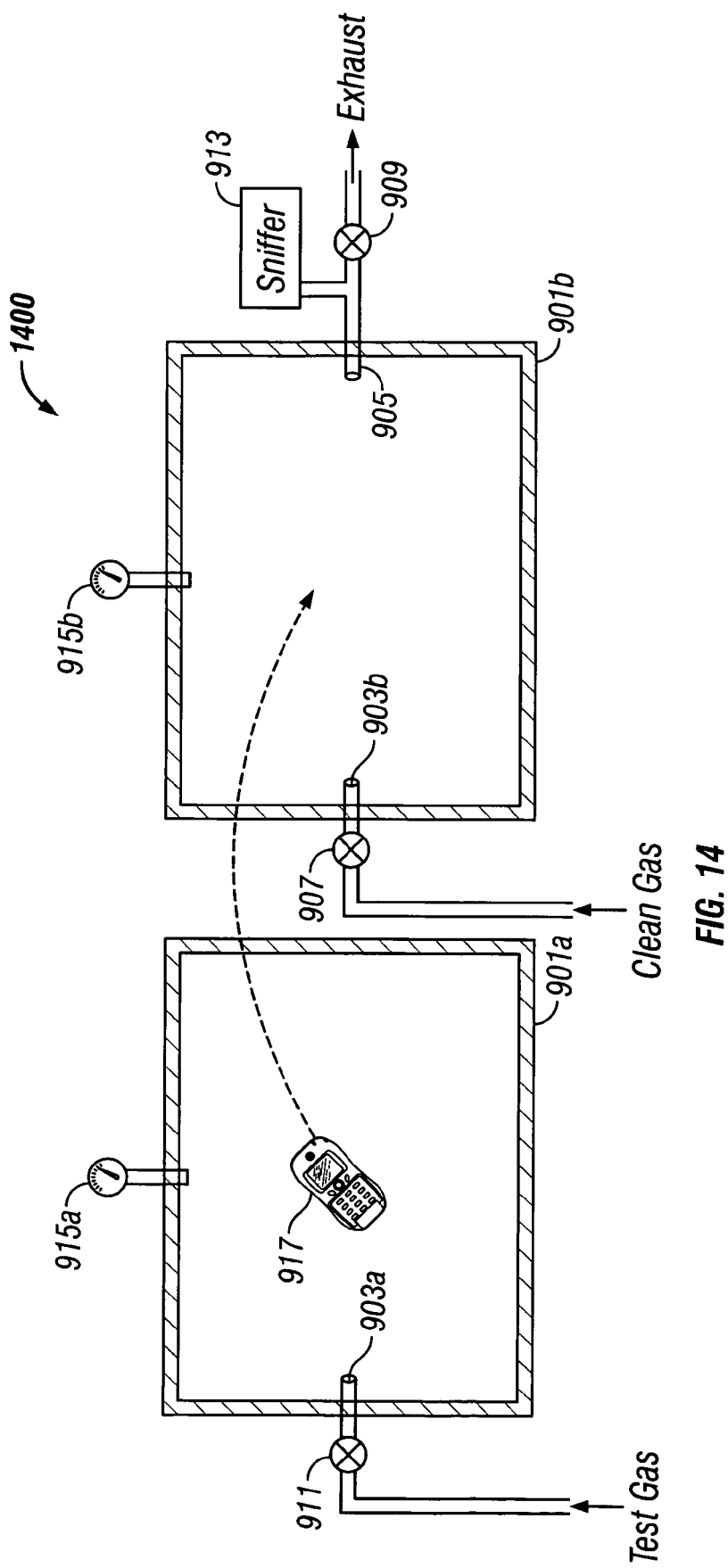
FIG. 14 is a system for a leak detection test according to another embodiment.

FIG. 14 illustrates another leak detection system 1400, utilizing two chambers. In the illustrated embodiment, the system 1400 comprises a test gas chamber 901a and an inspection chamber 901b. The test gas chamber 901a has an inlet 903a connected to a test gas supply via a test gas control valve 911. The inspection chamber 901b has an inlet 903b connected to a clean gas supply via a clean gas control valve 907 and an outlet 905 connected to an exhaust via an exhaust control valve 909. A sensor or sniffer 913 for detecting and measuring the concentration of the test gas is connected to the outlet 905. Pressure gauges 915a and 915b are connected to the chambers 901a and 901b, respectively. All of the discussions on the system 900 and its elements are applicable to the system 1400 and its elements unless specifically discussed otherwise.

Although illustrated in similar sizes, the test gas chamber 901a and the inspection chamber 901b may have different sizes. The test gas chamber 901a may be substantially bigger than the inspection chamber 901b. The volume of the test gas chamber 901a is, in some embodiment, from about 10 to about 500 times greater than the volume of the inspection chamber 901b. In other embodiments, the ratio of the test gas chamber 901a to the inspection chamber 901b is from about 50 to about 200. In still other embodiments, the ratio is from about 80 to about 120.

Figure 15:
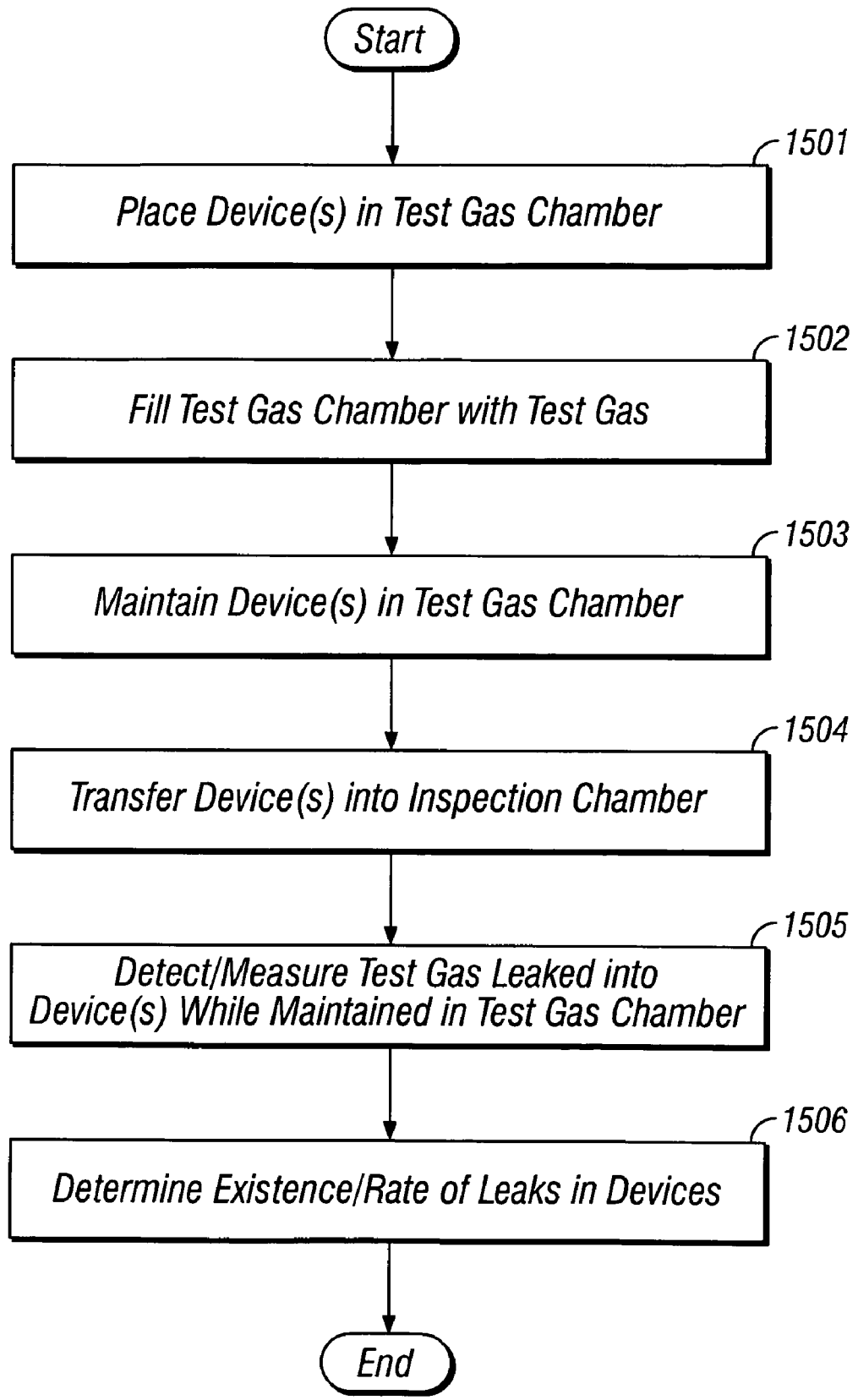
FIG. 15 is a flowchart of the test procedure utilizing the system of FIG. 14.

FIG. 15 provides a process flowchart for a leak detection test which utilizes the system 1400. Depending on the embodiments, additional steps may be added and/or some of the existing steps may be removed while the remaining steps are unchanged. In step 1501, the MEMS device to be tested 917 is placed in the test gas chamber 901a. Next at step 1502, the test gas chamber 901a is filled with the test gas. Continuing to step 1503, the device 917 is maintained in the test gas chamber 901a so as to let the test gas diffuse or permeate into the device 917. Then in step 1504, the device 917 is transferred to the inspection chamber 901b. After the transfer of the device 917, the inspection chamber 901b can be sealed air-tightly in a reversible manner. The transfer from the test gas chamber 901a to the inspection chamber 901b is made quickly, and the time period for the transfer may take from about 30 sec to about 2 min or less. Proceeding to step 1505, the sensor 913 detects and/or measures the test gas leaking out of the device 917. Based on the information collected by the sensor 913, the existence and/or rate of the leakage are determined (step 1506). The process steps of FIG. 15 are essentially the same as the process of FIG. 10 except that the flushing the test gas out of the test chamber (step 1004) is substituted for the transferring the device to the inspection chamber (step 1504) to accommodate the difference in the system configurations. All of the discussions relating to the process for the system 900 are applicable to the process for the system 1400 unless specifically discussed otherwise.

The foregoing embodiments have been described in terms of the testing of a single device at a time. However, the same technique can be used to test a plurality of devices simultaneously, utilizing a single system 900 or 1400. Testing multiple devices in a single running of the test is particularly useful in assuring the quality of the sealing of MEMS devices or other electronic devices requiring hermetic or permeable sealing. For example, a plurality of devices is tested under both of the no-flow condition and steady state condition in the system 900 or 1400 as described above. If the result of the no-flow condition test does not indicate large amount of test gas leakage while the result of the steady state condition test indicates only small leak rate (test gas concentration changing slowly), then it can be determined that the plurality of the devices includes one or more devices having a small leak rate. If the result of the no-flow condition test does not indicate large leakage and the result of the steady state condition test does not indicate small leak rate, then it can be determined that the plurality of the devices includes no devices having a large or small leak rate. If the result of the no-flow condition test does indicate large leakage while the result of the steady state condition test does not indicate small leak rate at all, it can be determined that the plurality of the devices has one or more devices having a large leak rate.

Figure 16:
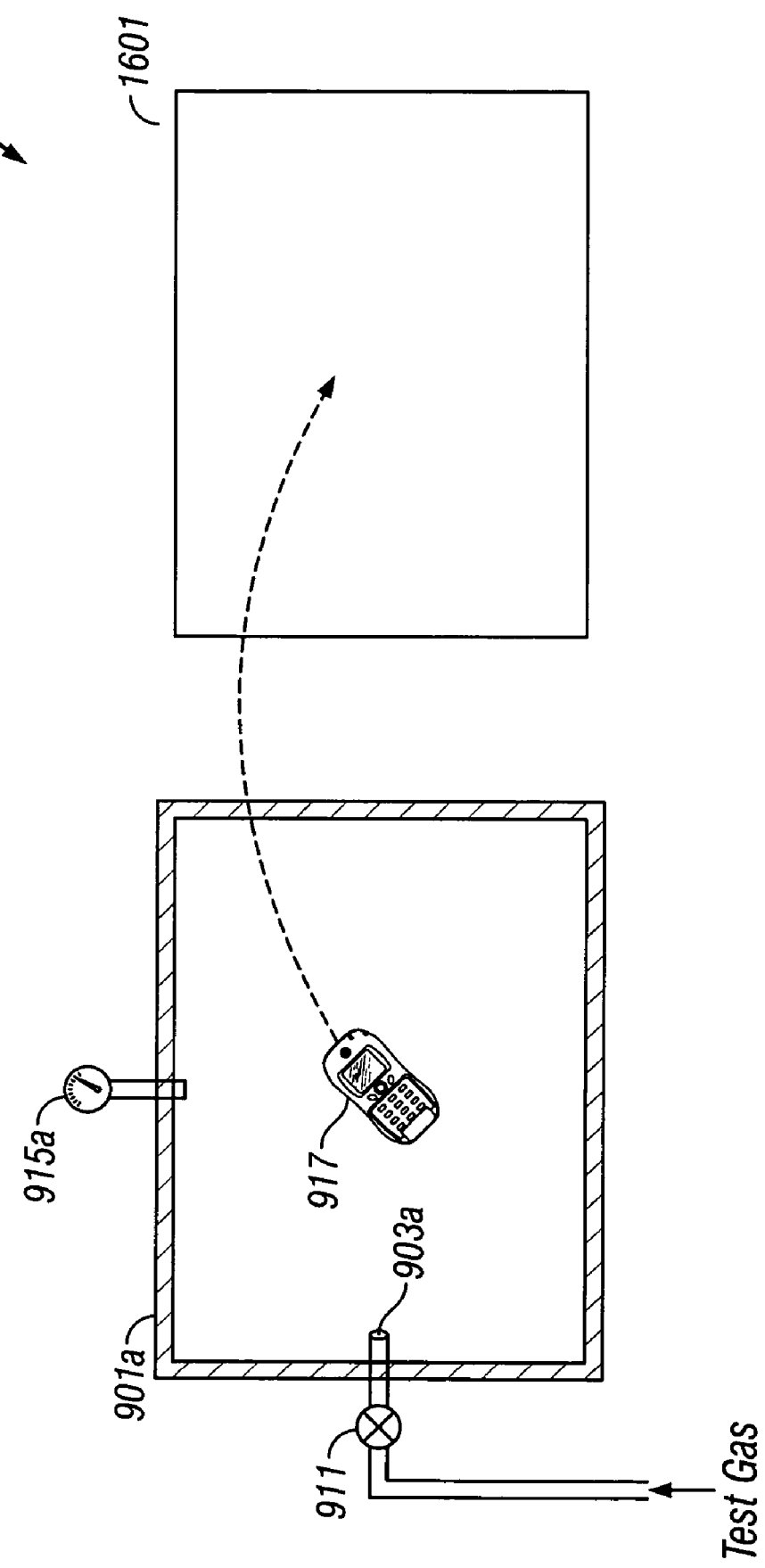
FIG. 16 is a system for a leak detection test according to still another embodiment.

FIG. 16 illustrates still another embodiment, wherein the leak detection system 1600 comprises a test gas chamber 901*a* and a test gas detection sub-system 1601. The test gas chamber 901*a* may be exactly the same as that of FIG. 14. All of the discussions on the test gas chamber 901*a* of FIG. 14 and its elements are applicable to the test gas chamber 901*a* and its elements of FIG. 16. The test gas detection sub-system 1601 will be further described in detail below. Although a single device 917 is illustrated in FIG. 16, the system 1600 can be used for leak detection testing of multiple devices in a single running of the test. One of ordinary skill in the art will appreciate the modifications needed for the use the system 1600 in the leak detection of multiple devices at once.

Figure 17:
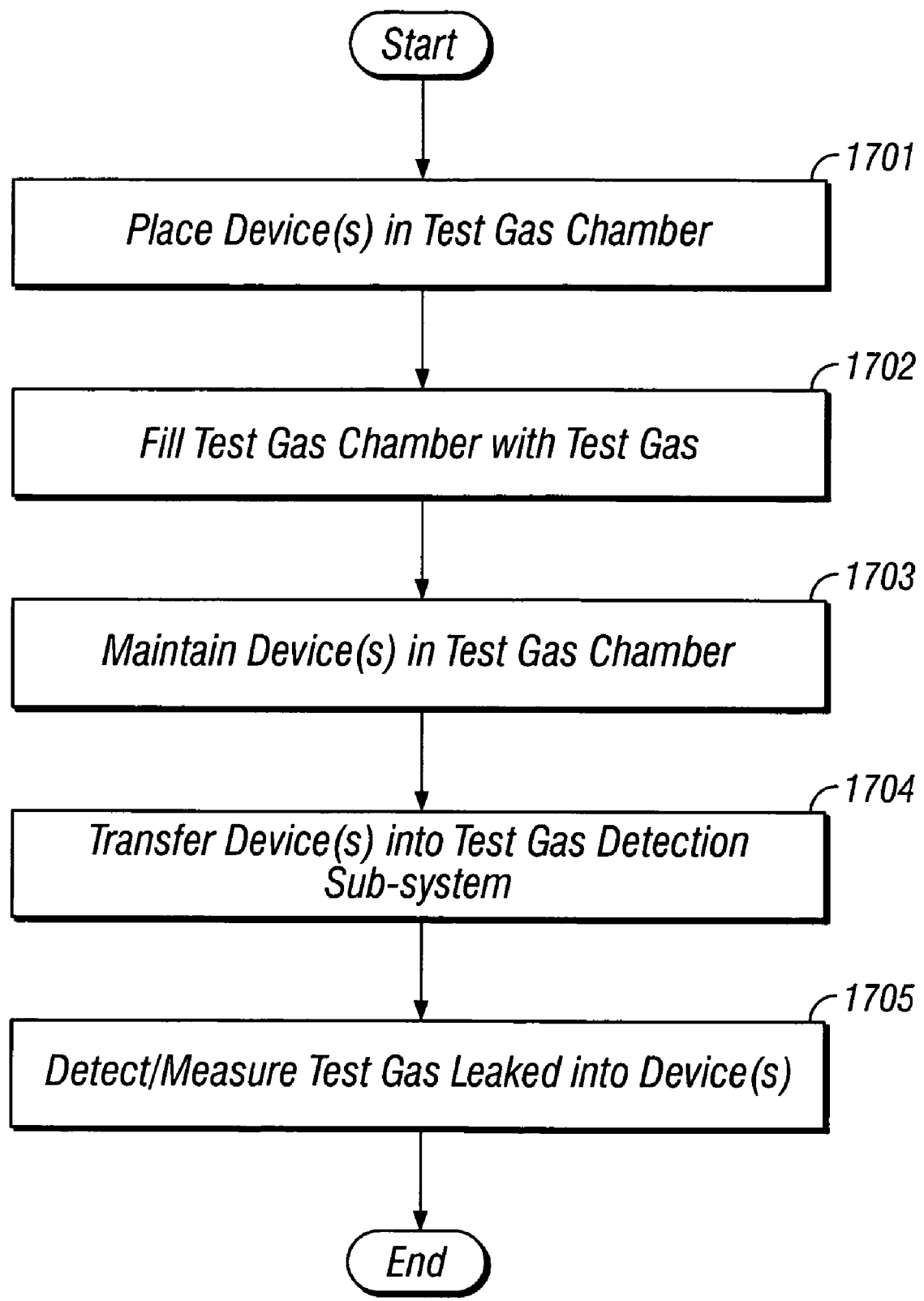
FIG. 17 is a flowchart of the test procedure utilizing the system of FIG. 16.

FIG. 17 provides a process flowchart for a leak detection test which utilizes the system 1600. Depending on the embodiments, additional steps may be added and/or some of the existing steps may be removed while the remaining steps are unchanged. In step 1701, the device to be tested 129 is placed in the test gas chamber 901*a*. Next at step 1702, the test gas chamber 901*a* is filled with the test gas. Continuing to step 1703, the device 917 is maintained in the test gas chamber 901*a* so as to let the test gas diffuse or permeate into the device 917. Next at step 1704, the device 917 is transferred to the test gas detection sub-system 1601. Proceeding to step 1705, the test gas entered the device 917 during steps 1102 and/or 1103 is detected or measured in the test gas detection sub-system 1601. The process steps of FIG. 17 are essentially the same as the process of FIG. 15 except that the inspection chamber (step 1504) is substituted for a test gas detection sub-system and that FIG. 17 does not include the step equivalent to step 1506. In certain embodiments, however, the process of leak detection test utilizing the system 1600 may include a step for determining the amount or level of the test gas remaining in the device 917 based on the information gathered in the detection step, step 1705. All of the discussions relating to the process of the leak detection test utilizing the system 1400 are applicable to the process for the system 1600 unless specifically discussed otherwise.

In one embodiment of the sub-system 1601, a certain range of wavelengths of light is applied onto the device 917 and a visible light emission is detected. In this embodiment, the test gas is chosen from gases having the property of fluorescence or phosphorescence upon exposure to the wavelengths of light. The test gases for use with this embodiment are, for example, $SO_2$, NO, CO, $CO_2$, etc. In one embodiment, the test gas are those that glow when exposed to ultraviolet (UV) light. One advantage of this embodiment is that the substrate 703 (FIGS. 7 and 2) of the device 917 is transparent for the UV light to be applied to the device 917 and for the visible light emitted from the test gas. One of ordinary skill in the art will appreciate gases available for the test gas in this embodiment.

In the foregoing embodiment of the sub-system 1601, the existence of the test gas in the device 917 may be detected by human eyes as long as the visible light emission from the test gas is distinguishable from the environment. Alternatively or additionally, a detector for the visible light emission may be employed. In this embodiment, the test gas detection sub-system 1601 comprises a light source for the wavelengths of light, for example, a UV light source. Also, the sub-system 1601 may comprises a detector for detecting the visible light emission from the test gas. One of ordinary skill in the art will appreciate various constructions of the sub-system 1601 and its components.

In another embodiment of the sub-system 1601, a laser or other light beam is applied onto the device 917 and the absorption of photons from the laser or other light beam is detected. The test gas is chosen from gases that experience an optical transition at an energy level which can be exited with a laser or other light beam. Gases having the described property include, for example, Ne and Rn. One of ordinary skill in the art will appreciate gases available for the test gas in this embodiment. The existence of the test gas within the device 917 can be found by measuring intensity reduction of the laser or light beam by the test gas' absorption of photons from the beam. The sensitivity of this embodiment may depend on choice of the laser or other light beam and the strength of the optical transition of the test gas. In one embodiment, the sensitivity can be increased by making the path of the laser or light beam pass through the device 917 multiple times, in which more absorption occurs and the intensity reduction can be amplified.

In the foregoing embodiment, the laser or other light beam is pass through a transparent portion of the test device 917. In one embodiment, the device 917 comprises a window for the laser or other light beam to pass through on the front and back of the device (not illustrated). A portion of the transparent substrate 703 (FIG. 7) may function as the window on the front side 705 (FIG. 7) of the device 917. Alternatively, the device 917 may have a single window for passing the light beam through along with a cell made of a mirror, for example, a reflective metallic surface. One of ordinary skill in the art will appreciate various constructions of the sub-system 1601 and its components in this embodiment.

In still another embodiment, the sub-system 1601 utilizes nuclear physics properties of the test gas. A radioactive gas may be used as the test gas. Since the use of radioactive gas would create health and safety concerns, a non-radioactive isotope may be used instead. The test gas is excited using a very selective nuclear reaction. For example, the $^3$He isotope of Helium can be excited by neutron and generate a gamma ray. The nuclear reaction is "n+$^3$He→$^4$He+γ". The gamma ray can be measured with a conventional nuclear detector with high accuracy on its energy to distinguish it from background radiation. One of ordinary skill in the art will appreciate other non-radioactive isotope available for the test gas and other neutron capturing reactions that generate gamma rays.

In this embodiment, the sub-system 1601 requires a neutron source, such as a sealed radioactive source of thermal neutrons and a gamma ray detector. The amount of the gamma rays measured in this embodiment is proportional to the amount of the test gas contained in the device 917 under test 129. Thus, the amount of the test gas remaining in the device 917 can be calculated and used to determine the size of the leakage in the device 917. Unlike in the foregoing embodiments, this embodiment does not require any window or area in the device 917 because thermal neutrons and gamma rays can transmit the substrate 703 (FIG. 1) of the device 917 and/or back-plate 707 with reasonable efficiency.

The foregoing embodiments of leak detection testing have been described in terms of MEMS devices. However, these embodiments are not limited to the leak detection testing of MEMS devices. Rather, all of the embodiments and variants thereof can be applied to leak detection testing of any electronic or electrical devices having an element to be hermetically or permeably sealed as discussed above with reference to the MEMS devices. In some embodiments the leak detecting testing are conducted for electronic packages containing microelectromechanical systems therein. The electronic packages can be of display devices including reflective displays.

It is to be understood that persons of skill in the appropriate arts may modify the invention here described while still achieving the favorable results of this invention. Accordingly, the foregoing description is to be understood as being a broad, teaching disclosure directed to persons of skill in the appropriate arts, and not as limiting upon the invention.

What is claimed is:

1. A method of detecting a leak in an electronic device, comprising:
    providing an electronic device having an interior space, wherein the electronic device is substantially free of a test gas;
    placing the electronic device in a substantially atmospheric pressure test gas environment comprising the test gas, whereby the test gas may diffuse into the interior space;
    placing the electronic device in a substantially atmospheric pressure non-test gas environment substantially free of the test gas; and
    detecting test gas that leaked from the electronic device or the interior space of the electronic device while the electronic device is placed in the non-test gas environment,
    wherein the test gas environment and the non-test gas environment are created in a single chamber.

2. The method of claim 1, wherein the test gas environment has a pressure that is non-destructive to the electronic device.

3. The method of claim 1, wherein the non-destructive pressure is from about 0.8 atm to about 1.2 atm.

4. The method of claim 1, wherein detecting leakage comprises measuring an amount of the test gas existing in the non-test gas environment.

5. The method of claim 1, wherein detecting leakage comprises monitoring a relative amount of the test gas in the non-test gas environment over time.

6. The method of claim 1, further comprising determining whether the electronic device has an unintended leak based on the detection.

7. The method of claim 1, wherein the test gas environment is created by flowing the test gas through an area where the electronic device is placed.

8. The method of claim 1, wherein the non-test gas environment is created in a closed chamber substantially free of the test gas.

9. The method of claim 1, wherein the non-test gas environment is created by flowing a non-test gas through an area where the electronic device is placed.

10. The method of claim 1, wherein the non-test gas environment has a pressure that is non-destructive to the electronic device.

11. The method of claim 10, wherein the non-destructive pressure is from about 0.8 atm to about 1.2 atm.

12. The method of claim 1, wherein detecting leakage comprises sensing existence of the test gas within the electronic device.

13. The method of claim 12, wherein detecting leakage comprises measuring a relative amount of the test gas within the electronic device.

14. The method of claim 12, wherein sensing existence of the test gas within the electronic device comprises:
    applying radiation of light to the electronic device; and
    detecting a response of the test gas to the radiation.

15. The method of claim 14, wherein the light is UV, and wherein the test gas emits visible light when exposed to the UV.

16. The method of claim 14, wherein radiation of light is applied to a portion of the electronic device that is transparent to the light.

17. The method of claim 14, wherein the light is a laser beam, and wherein the test gas absorbs the laser beam.

18. The method of claim 17, wherein detecting a response comprises measuring reduction of intensity of the laser beam.

19. A method of detecting a leak in an electronic device, comprising:
    providing an electronic device in a chamber, wherein the electronic device is substantially free of a test gas;
    supplying the test gas to the chamber to create a substantially atmospheric pressure test gas environment within the chamber, wherein the test gas diffuses into the electronic device;
    flushing the test gas out of the chamber;
    supplying a non-test gas to the chamber to create a substantially atmospheric pressure non-test gas environment within the chamber; and
    detecting test gas that leaked from the electronic device or the electronic device existing in the non-test gas environment,
    wherein the test gas environment and the non-test gas environment are created in a single chamber.

20. The method of claim 19, wherein the test gas comprises a noble gas.

21. The method of claim 19, wherein the test gas is substantially non-reactive with a desiccant.

22. The method of claim 19, wherein the electronic device is substantially hermetically sealed with regard to water vapor.

23. The method of claim 19, wherein the electronic device is substantially permeably sealed with regard to water vapor.

24. A system for testing an electronic device for leakage, comprising:
- a test chamber;
- a supply of a test gas connected to the test chamber;
- a supply of a non-test gas connected to the chamber;
- a test gas sensor connected to the test chamber; and
- a controller coupled to the supply of a test gas, the supply of a non-test gas, and the sensor, where the controller is adapted to sequentially supply the test gas into the test chamber to create a substantially atmospheric pressure test gas environment within the test chamber; then to supply the non-test gas into the test chamber to purge the test gas and to create a substantially atmospheric pressure non-test gas environment within the test chamber; and then to detect the test gas existing in the test chamber or flowing out of the test chamber while the electronic device is in the non-test gas environment.

25. The system of claim 24, further comprising a processor configured to determine from data of the test gas detected by the sensor whether there is leak in an electronic device under test.

26. A system for testing an electronic device for leakage, comprising:
- a test chamber;
- means for creating a test gas environment in the test chamber;
- means for creating a non-test gas environment in the test chamber;
- means for detecting the test gas; and
- a controller coupled to means for creating a test gas environment, means for creating a non-test gas environment, and the means for detecting the test gas, where the controller is adapted to sequentially create a substantially atmospheric pressure test gas environment within the test chamber, then to purge the test gas by creating a substantially atmospheric pressure non-test gas environment within the test chamber, and then to operate the means for detecting the test gas in order to detect test gas that has leaked from the interior of the electronic device when the device is in the non-test gas environment.

27. A method of detecting a leak in an electronic device, comprising:
- providing an electronic device having an interior space;
- placing the electronic device in a test gas environment comprising a test gas, wherein the electronic device is substantially free of the test gas;
- placing the electronic device in a non-test gas environment substantially free of the test gas; and
- detecting the test gas while the electronic device is placed in the non-test gas environment,
- wherein detecting leakage comprises sensing existence of the test gas within the electronic device, and wherein sensing existence of the test gas within the electronic device comprises:
- applying energy particles to the electronic device, wherein the test gas involves in a nuclear reaction with the energy particle; and
- detecting radiation resulting from the nuclear reaction.

* * * * *